US012641843B2

(12) United States Patent
Park et al.

(10) Patent No.: US 12,641,843 B2
(45) Date of Patent: May 26, 2026

(54) TRANSISTOR STACKS HAVING SPACERS, AND RELATED FABRICATION METHODS

(71) Applicant: Samsung Electronics Co., Ltd., Suwon-si (KR)

(72) Inventors: Keumseok Park, Slingerlands, NY (US); Jaejik Baek, Watervliet, NY (US); Kang-ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 916 days.

(21) Appl. No.: 17/934,533

(22) Filed: Sep. 22, 2022

(65) Prior Publication Data

US 2023/0395659 A1     Dec. 7, 2023

Related U.S. Application Data

(60) Provisional application No. 63/347,663, filed on Jun. 1, 2022.

(51) Int. Cl.

| | |
|---|---|
| *H10D 62/10* | (2025.01) |
| *H01L 25/11* | (2006.01) |
| *H10D 30/67* | (2025.01) |
| *H10D 62/13* | (2025.01) |
| *H10D 64/01* | (2025.01) |
| *H10D 84/01* | (2026.01) |
| *H10D 84/03* | (2025.01) |
| *H10W 90/00* | (2026.01) |

(52) U.S. Cl.
CPC ....... *H10D 62/121* (2025.01); *H10D 30/6757* (2025.01); *H10D 62/151* (2025.01); *H10D 64/021* (2025.01); *H10D 84/0128* (2025.01);

*H10D 84/013* (2025.01); *H10D 84/0147* (2025.01); *H10D 84/038* (2025.01); *H10W 90/00* (2026.01)

(58) Field of Classification Search
CPC ....... H01L 25/117; H01L 22/26; H01L 22/34; H10D 64/021; H10D 62/121
See application file for complete search history.

(56) References Cited

U.S. PATENT DOCUMENTS

| | | | |
|---|---|---|---|
| 10,840,146 B1 | 11/2020 | Paul et al. | |
| 11,133,310 B2 | 9/2021 | Fulford et al. | |
| 11,164,793 B2 | 11/2021 | Xie et al. | |
| 11,315,923 B2 | 4/2022 | Reznicek et al. | |
| 2019/0097011 A1* | 3/2019 | Wu | H10D 84/85 |
| 2021/0035870 A1 | 2/2021 | Young et al. | |
| 2021/0184000 A1 | 6/2021 | Ramaswamy et al. | |
| 2022/0165731 A1 | 5/2022 | Huang et al. | |
| 2022/0278195 A1* | 9/2022 | Ando | H01L 21/0259 |
| 2023/0178598 A1* | 6/2023 | Ando | H10D 84/014 257/288 |

* cited by examiner

*Primary Examiner* — Britt Hanley
*Assistant Examiner* — Casey Paul Boatman
(74) *Attorney, Agent, or Firm* — Myers Bigel, P.A.

(57) ABSTRACT

Transistor devices are provided. A transistor device includes a transistor stack including first and second transistors. The transistor device includes an insulating spacer that is on a sidewall of a first gate of the first transistor and between a plurality of first semiconductor channel layers of the first transistor. Moreover, the transistor device includes a semiconductor spacer that is on a sidewall of a second gate of the second transistor and between a plurality of second semiconductor channel layers of the second transistor. Related methods of forming transistor devices are also provided.

19 Claims, 26 Drawing Sheets

Figure 1:
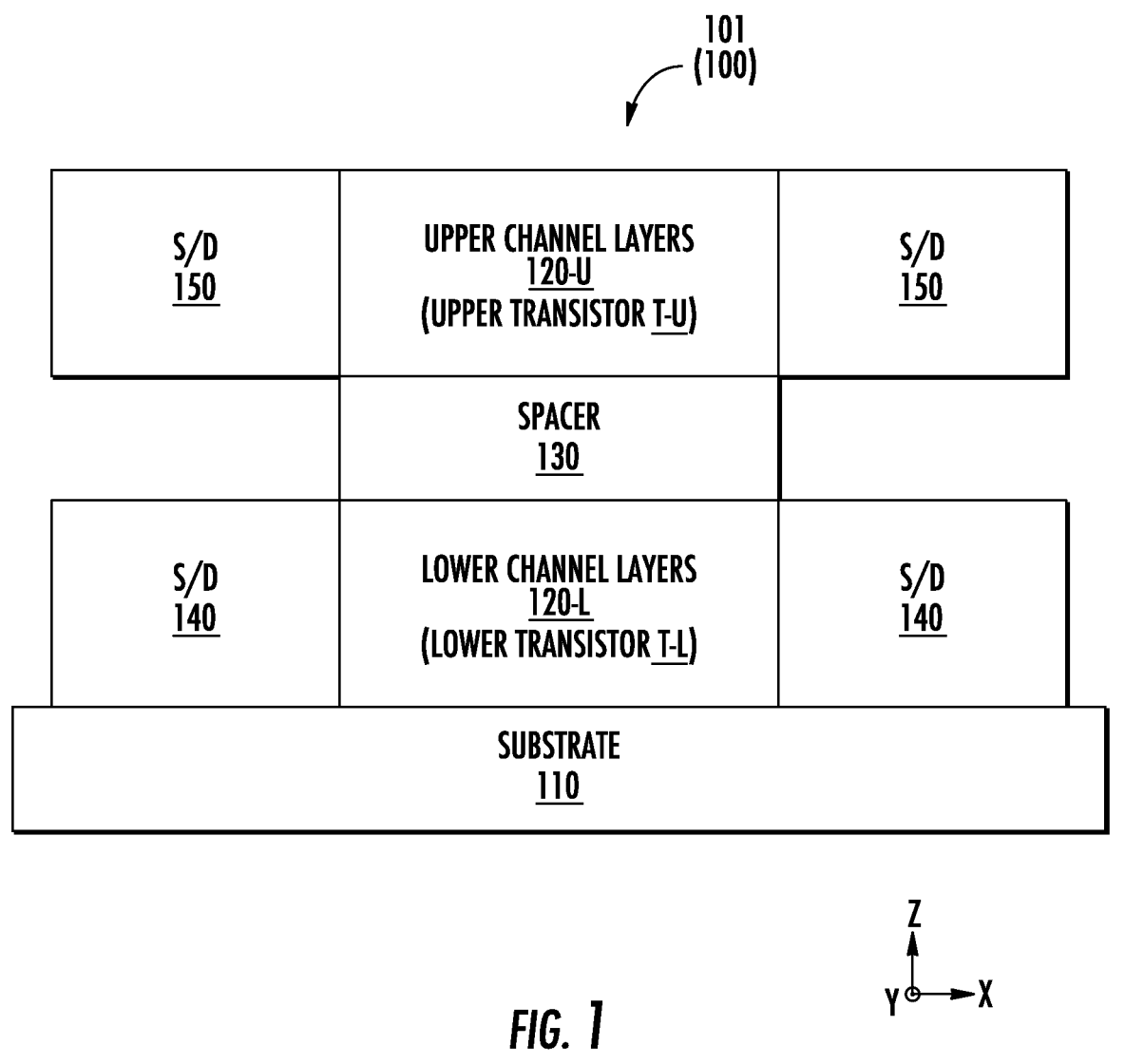

101
(100)

| S/D 150 | UPPER CHANNEL LAYERS 120-U (UPPER TRANSISTOR T-U) | S/D 150 |
|---|---|---|

SPACER
130

| S/D 140 | LOWER CHANNEL LAYERS 120-L (LOWER TRANSISTOR T-L) | S/D 140 |
|---|---|---|

SUBSTRATE
110

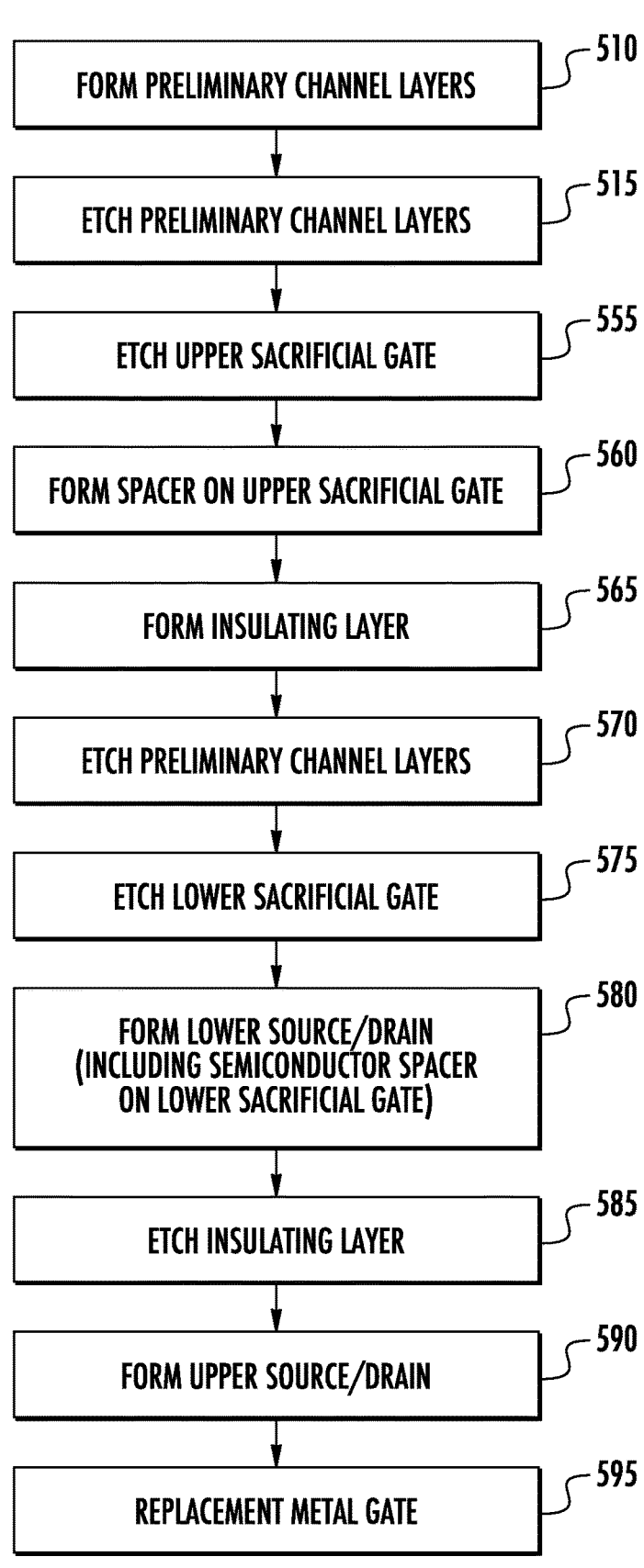

FORM PRELIMINARY CHANNEL LAYERS — 510

ETCH PRELIMINARY CHANNEL LAYERS — 515

ETCH UPPER SACRIFICIAL GATE — 555

FORM SPACER ON UPPER SACRIFICIAL GATE — 560

FORM INSULATING LAYER — 565

ETCH PRELIMINARY CHANNEL LAYERS — 570

ETCH LOWER SACRIFICIAL GATE — 575

FORM LOWER SOURCE/DRAIN
(INCLUDING SEMICONDUCTOR SPACER
ON LOWER SACRIFICIAL GATE) — 580

ETCH INSULATING LAYER — 585

FORM UPPER SOURCE/DRAIN — 590

REPLACEMENT METAL GATE — 595

*FIG. 5B*

TRANSISTOR STACKS HAVING SPACERS, AND RELATED FABRICATION METHODS

CLAIM OF PRIORITY

The present application claims the benefit of U.S. Provisional Patent Application Ser. No. 63/347,663, filed on Jun. 1, 2022, entitled METHOD OF FORMING STACKED DEVICES INCLUDING AN INNER SPACER OF A SOURCE/DRAIN REGION, the disclosure of which is hereby incorporated herein in its entirety by reference.

FIELD

The present disclosure generally relates to the field of semiconductor devices and, more particularly, to three-dimensional transistor structures.

BACKGROUND

The density of transistors in electronic devices has continued to increase. Though three-dimensional transistor structures can help to increase transistor density, it may be difficult to form some features of three-dimensional transistor structures. For example, though transistors may be stacked on top of each other, it may be difficult to form source/drain regions of stacked transistors.

SUMMARY

A transistor device, according to some embodiments herein, may include a substrate and a transistor stack including first and second transistors on the substrate. The first transistor may include: a plurality of first semiconductor channel layers; a first gate on the plurality of first semiconductor channel layers; and an insulating spacer that is on a sidewall of the first gate and between the plurality of first semiconductor channel layers. The second transistor may include: a plurality of second semiconductor channel layers; a second gate on the plurality of second semiconductor channel layers; and a semiconductor spacer that is on a sidewall of the second gate and between the plurality of second semiconductor channel layers.

A transistor device, according to some embodiments herein, may include a substrate and first and second transistors that are stacked on the substrate. An insulating spacer of the first transistor may be on a sidewall of a gate of the first transistor and between a pair of semiconductor channel layers of the first transistor. No insulating spacer may be on any sidewall of a gate of the second transistor and between a pair of semiconductor channel layers of the second transistor. Moreover, the first and second transistors may be NMOS and PMOS transistors, respectively, or vice versa.

A method of forming a transistor device, according to some embodiments herein, may include forming an insulating spacer between a plurality of first semiconductor channel layers of a first transistor. The method may include forming a semiconductor spacer between a plurality of second semiconductor channel layers of a second transistor. The first and second transistors may be in a transistor stack with each other. The insulating spacer may be on a sidewall of a first gate of the first transistor. Moreover, the semiconductor spacer may be on a sidewall of a second gate of the second transistor.

BRIEF DESCRIPTION OF THE DRAWINGS

FIG. 1 is a schematic block diagram of a transistor stack of a transistor device according to some embodiments herein.

FIGS. 3A-3K are cross-sectional views illustrating operations of forming the transistor stack of FIG. 2A.

FIG. 5B is a flowchart corresponding to the operations shown in FIGS. 4A-4J.

DETAILED DESCRIPTION

Figure 2A:
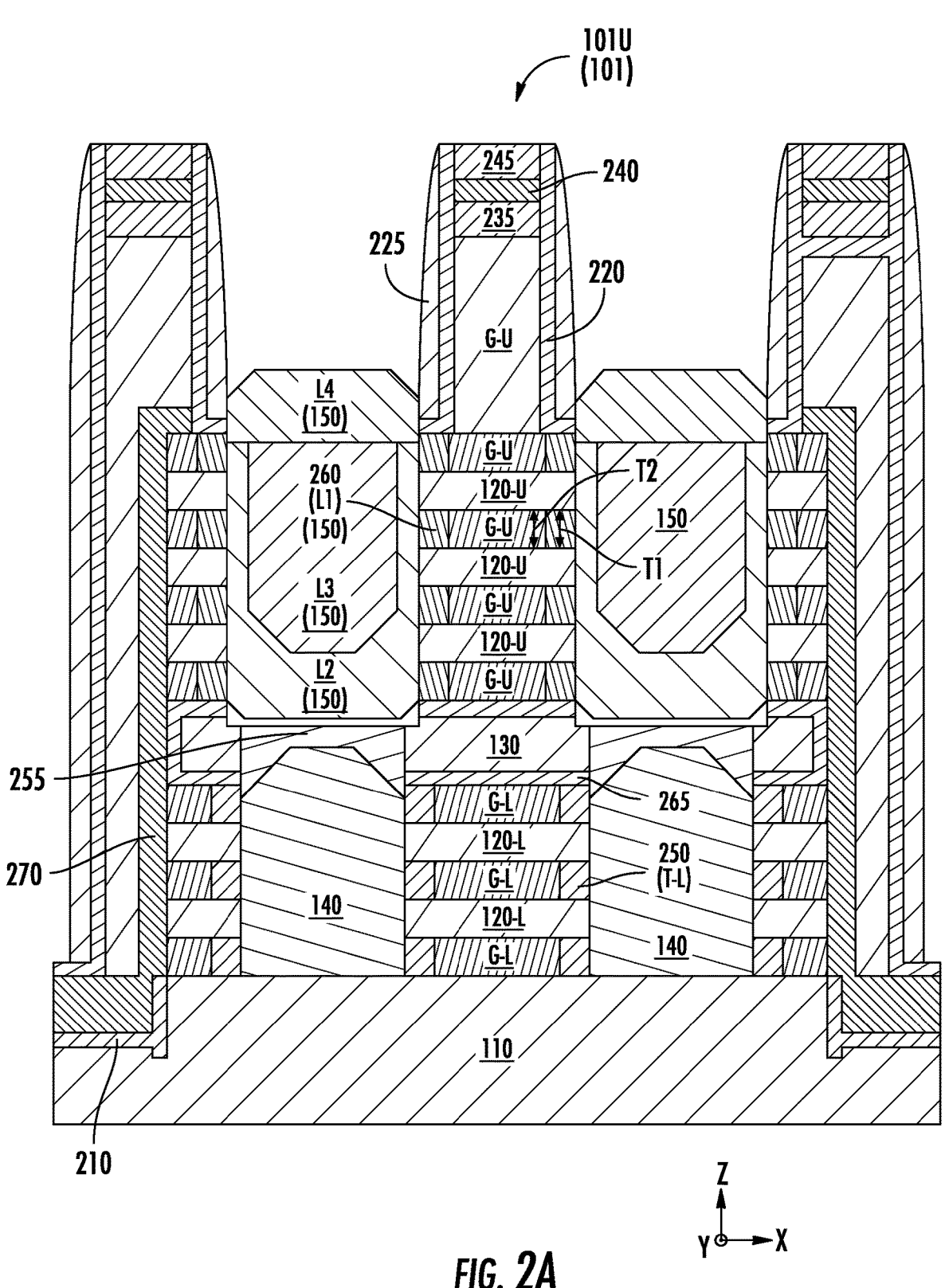
FIGS. 2A and 2B are example cross-sectional views of the transistor stack of FIG. 1.

Pursuant to embodiments herein, transistor devices are provided that include semiconductor spacers, in addition to insulating spacers. The semiconductor spacers can each be used as a seed layer for epitaxially growing source/drain regions, and thus can help to grow the source/drain regions with fewer defects. Because the source/drain regions have fewer defects, they can better apply stress to semiconductor channel regions (e.g., channel layers, such as nanosheets or nanowires).

In some embodiments, a transistor device may include a transistor stack having an upper transistor and a lower transistor. One of the upper transistor or the lower transistor may include a gate and a semiconductor spacer on a sidewall thereof. The semiconductor spacer and the gate may be between a plurality (e.g., a pair) of semiconductor channel layers. No insulating spacer may be on any sidewall of the gate. Moreover, the other one of the upper transistor or the lower transistor may include another gate and an insulating spacer on a sidewall thereof. The insulating spacer and the other gate may be between a plurality (e.g., a pair) of semiconductor channel layers.

According to some embodiments, insulating spacers and semiconductor spacers may selectively be included in different types of metal-oxide-semiconductor field-effect transistors ("MOSFETs") that are in a transistor stack. For example, semiconductor spacers may be included in a PMOS transistor of the transistor stack and insulating spacers may be included in an NMOS transistor of the transistor stack, or vice versa, depending on the specifications of a transistor device that includes the transistor stack. Accordingly, semiconductor spacers can be in either the NMOS transistor or the PMOS transistor. In some embodiments, semiconductor spacers can be part of multi-layer source/drain region growth. Moreover, the PMOS and NMOS transistors may be upper and lower transistors, respectively, or vice versa.

Example embodiments will be described in greater detail with reference to the attached figures.

FIG. 1 is a schematic block diagram of a transistor stack 101 of a transistor device 100 according to some embodiments herein. The transistor stack 101 includes a lower transistor T-L having a stack of a plurality of lower semiconductor channel layers 120-L and an upper transistor T-U having a stack of a plurality of upper semiconductor channel layers 120-U. The lower transistor T-L is between, in a vertical direction Z, the upper transistor T-U and a substrate 110. Moreover, a spacer 130 may, in some embodiments, be between the lower and upper transistors T-L, T-U. For example, the spacer 130 may be an insulating spacer.

The lower semiconductor channel layers 120-L of the lower transistor T-L are between, in a first horizontal direction X, a pair of lower source/drain regions 140 that are electrically connected to the lower semiconductor channel layers 120-L. The directions X and Z may be perpendicular to each other, and a second horizontal direction Y may be perpendicular to each of the directions X and Z. Each lower semiconductor channel layer 120-L may be implemented by, for example, a nanosheet or nanowire between the lower source/drain regions 140. Likewise, the upper semiconductor channel layers 120-U of the upper transistor T-U are between, in the direction X, a pair of upper source/drain regions 150 that are electrically connected to the upper semiconductor channel layers 120-U. Each upper semiconductor channel layer 120-U may be implemented by, for example, a nanosheet or nanowire between the upper source/drain regions 150.

In some embodiments, the upper source/drain regions 150 may include a different semiconductor material from that of the lower source/drain regions 140. For example, the upper source/drain regions 150 may include silicon germanium, and the lower source/drain regions 140 may include silicon carbide, or vice versa.

For simplicity of illustration, only one transistor stack 101 is shown in FIG. 1. In some embodiments, however, the device 100 may include two, three, four, or more transistor stacks 101.

Figure 2B:
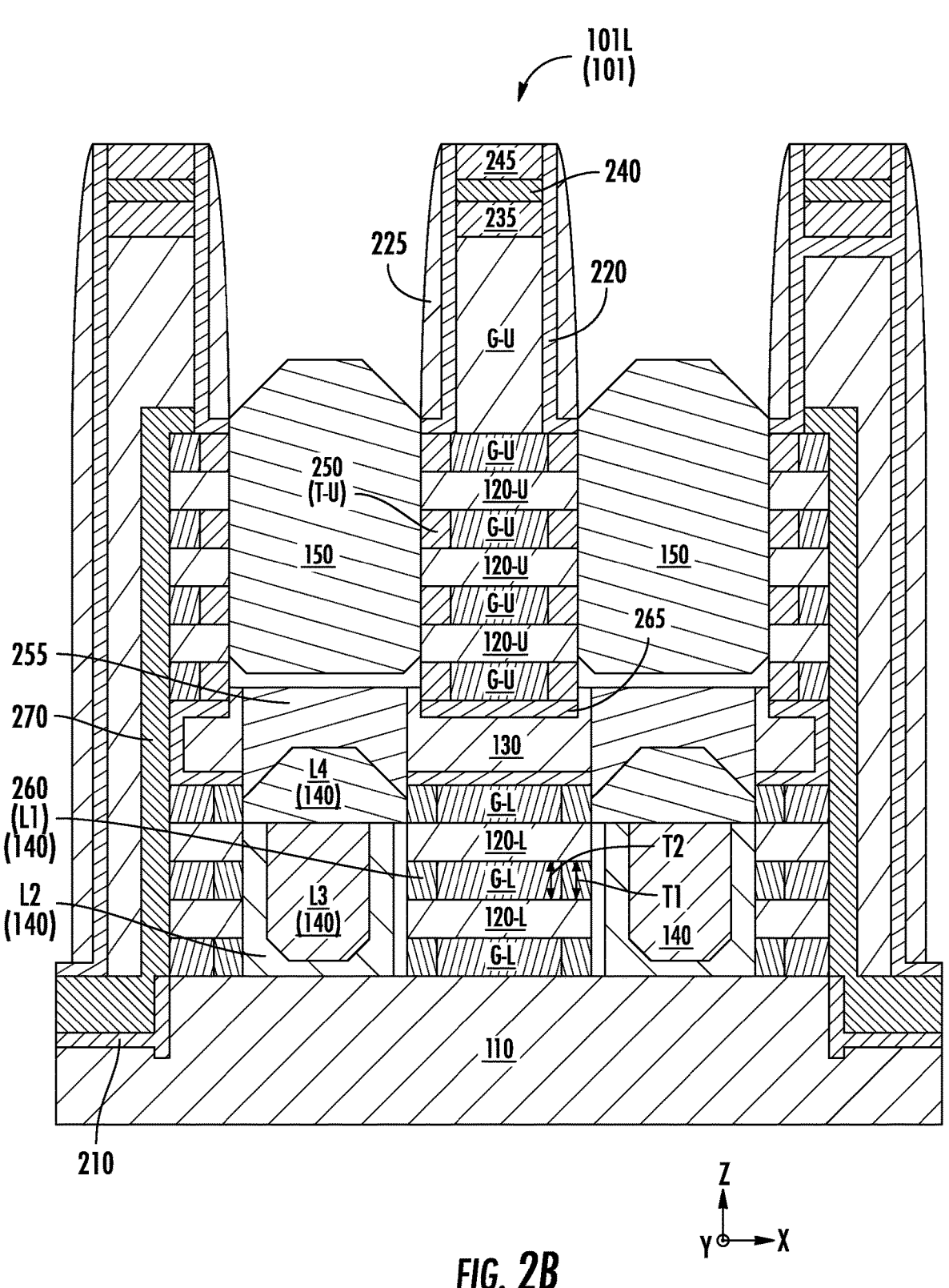

FIGS. 2A and 2B are example cross-sectional views of the transistor stack 101 of FIG. 1. Transistor stacks 101U, 101L in FIGS. 2A and 2B are different examples of the transistor stack 101. The structures shown in FIGS. 2A and 2B include insulating spacers 250 that are selectively formed in the lower and upper transistors T-L and T-U, respectively.

Thus, instead of having insulating spacers 250 in both the lower and upper transistors T-L, T-U, the upper transistor T-U of a transistor stack 101U shown in FIG. 2A includes semiconductor spacers 260 in places where insulating spacers 250 might otherwise be present. More particularly, FIG. 2A shows semiconductor spacers 260 in the upper transistor T-U, but insulating spacers 250 are found in the lower transistor T-L. Analogously, the lower transistor T-L of a transistor stack 101L shown in FIG. 2B includes semiconductor spacers 260 rather than insulating spacers 250, and the upper transistor T-U of FIG. 2B has insulating spacers 250. Accordingly, in the transistor stacks 101U, 101L, insulating spacers 250 are present in one of the transistors T-L, T-U, but not both. Insulating spacers 250 and semiconductor spacers 260 may also be referred to herein as "inner spacers," as they are situated between nanosheet/nanowire channels within a transistor, as further described below.

As shown in FIG. 2A, though sidewalls of the lower semiconductor channel layers 120-L of the lower transistor T-L may contact the lower source/drain regions 140, a lower gate G-L of the lower transistor T-L may be spaced apart from the lower source/drain regions 140 in the direction X by insulating spacers 250. The insulating spacers 250 may be on sidewalls of the lower gate G-L and between, in the direction Z, the lower semiconductor channel layers 120-L. According to some embodiments, the insulating spacers 250 may contact the lower source/drain regions 140 and sidewalls of the lower gate G-L. Moreover, the insulating spacers 250 may comprise, for example, nitrogen (e.g., silicon nitride).

An upper gate G-U of the upper transistor T-U may contact semiconductor spacers 260 rather than insulating spacers 250. The semiconductor spacers 260 may be on sidewalls of the upper gate G-U and between, in the direction Z, the upper semiconductor channel layers 120-U. The semiconductor spacers 260 do not include nitrogen. Rather, the semiconductor spacers 260 may include, for example, silicon germanium, silicon carbide, or silicon that is free of germanium, carbon, and nitrogen. Moreover, sidewalls of the upper semiconductor channel layers 120-U of the upper transistor T-U may contact the upper source/drain regions 150.

In some embodiments, the semiconductor spacers 260 may be part of the upper source/drain regions 150. For example, each semiconductor spacer 260 may be part of a first layer L1 of the upper source/drain regions 150, and the sidewalls of the upper semiconductor channel layers 120-U may contact a second layer L2 of the upper source/drain regions 150. A third layer L3 of the upper source/drain regions 150 may be between sidewalls of the second layer L2.

Moreover, a fourth layer L4 of the upper source/drain regions 150 may be on top of the second and third layers L2, L3 and may serve as a buffer layer that protects the second and third layers L2, L3 from etching (e.g., while forming an overlying contact). According to some embodiments, the layer L4 may be at a level above each of the upper semiconductor channel layers 120-U.

The first through fourth layers L1-L4 may be semiconductor layers that comprise different concentrations of a semiconductor element. As an example, the first through fourth layers L1-L4 may each comprise silicon germanium, where the first and fourth layers L1, L4 comprise 0-5 atomic percent germanium, the second layer L2 comprises 0-20 atomic percent germanium, and the third layer L3 comprises 0-55 atomic percent germanium. Accordingly, the second and third layers L2, L3 may comprise higher concentrations of germanium than the first and fourth layers L1, L4. Moreover, the first through fourth layers L1-L4 may, in some embodiments, each include more than 0 atomic percent germanium, and thus may have a lattice mismatch with respect to the upper semiconductor channel layers 120-U, which may comprise, for example, silicon layers that are free of carbon, germanium, and nitrogen. Such a lattice mismatch may be desirable for stress engineering.

Though the lower source/drain regions 140 are shown in FIG. 2A as being single-layer source/drain regions, the lower source/drain regions 140 may, in some embodiments, include multiple semiconductor layers (e.g., layers analogous to the second through fourth layers L2-L4), at least one of which may contact the insulating spacers 250. Accordingly, the lower source/drain regions 140 may be either single-layer or multi-layer source/drain regions.

According to some embodiments, a thickness T1, in the direction Z, of a semiconductor spacer 260 may be equal to a thickness T2, in the direction Z, of a portion of the upper gate G-U that the semiconductor spacer 260 contacts. The portion of the upper gate G-U may be between two (i.e., a pair) of the upper semiconductor channel layers 120-U.

The upper and lower transistors T-U, T-L may be different types of MOSFETs. For example, the upper and lower transistors T-U, T-L may be PMOS and NMOS transistors, respectively, or vice versa. As an example, PMOS and NMOS transistors may be provided by source/drain regions comprising silicon germanium and silicon carbide, respectively. In some embodiments, a spacer 130 may comprise an isolation region that separates the lower semiconductor channel layers 120-L of the lower transistor T-L from the upper semiconductor channel layers 120-U of the upper transistor T-U, as well as separating the insulating spacers 250 from the semiconductor spacers 260.

For simplicity of illustration, a gate insulation layer is omitted from view in FIG. 2A. It will be understood, however, that a gate insulation layer may extend between each semiconductor channel layer 120 and a gate G. For example, a gate insulation layer may be between each upper semiconductor channel layer 120-U and the upper gate G-U, and may be between each lower semiconductor channel layer 120-L and the lower gate G-L. The gate insulation layer may wrap around each semiconductor channel layer 120 and may be thinner than the spacer 130.

According to some embodiments, an insulating layer 210 may be in a recess of the substrate 110. An insulating layer 270 may also be in the recess, and may extend above the substrate 110 to, for example, a level of the fourth semiconductor layer L4. An insulating layer 255 may be between, in the direction Z, the lower and upper source/drain regions 140, 150. Moreover, an insulating layer 265 may be between an upper surface of the spacer 130 and the upper gate G-U, and/or between a lower surface of the spacer 130 and the lower gate G-L.

In some embodiments, a stack that includes layers 235, 240, and 245 may be on top of the portions of the upper gate G-U that contact the semiconductor spacers 260. For example, the layers 235, 240, and 245 may be insulating layers. Spacers 225 may be on sidewalls of an upper portion of the upper gate G-U and on sidewalls of the layers 235, 240, and 245, and an insulating layer 220 may be between the spacers 225 and the layers 235, 240, and 245 (and the upper portion of the upper gate G-U). According to some embodiments, the layers 235, 240, and 245 may be part of a multi-layer mask that is on top of the upper portion of the upper gate G-U. In other embodiments, the mask may be a single-layer mask.

The spacer 130, the layers 235, 240, and 245, the insulating layers 210, 220, 255, 265, and 270, and/or the spacers 225 may comprise, for example, silicon oxide, silicon oxynitride, silicon nitride, or a low-k dielectric material. As used herein, the term "low-k" refers to a material that has a smaller dielectric constant than silicon dioxide. The low-k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

As shown in FIG. 2B, semiconductor spacers 260 may be on (e.g., in contact with) sidewalls of the lower gate G-L. Moreover, some of the semiconductor spacers 260 may be between the lower semiconductor channel layers 120-L. In some embodiments, the semiconductor spacers 260 may be part of the lower source/drain regions 140. For example, the lower source/drain regions 140 may include first through fourth layers L1-L4, and the semiconductor spacers 260 may be part of the first layer L1.

Sidewalls of the lower semiconductor channel layers 120-L may contact the second layer L2 of the lower source/drain regions 140. The third layer L3 of the lower source/drain regions 140 may be between sidewalls of the second layer L2. The fourth layer L4 of the lower source/drain regions 140 may be on top of the second and third layers L2, L3 and may serve as a buffer layer that protects the second and third layers L2, L3 from etching. According to some embodiments, the layer L4 may be at a level above each of the lower semiconductor channel layers 120-L. Moreover, the first through fourth layers L1-L4 of the lower source/drain regions 140 may be semiconductor layers that comprise different concentrations of a semiconductor element, such as the concentrations that are described herein with respect to the first through fourth layers L1-L4 of the upper source/drain regions 150 of FIG. 2A.

Though the upper source/drain regions 150 are shown in FIG. 2B as being single-layer source/drain regions, the upper source/drain regions 150 may, in some embodiments, include multiple semiconductor layers (e.g., layers analogous to the second through fourth layers L2-L4), at least one of which may contact insulating spacers 250. Accordingly, the upper source/drain regions 150 may be either single-layer or multi-layer source/drain regions.

Insulating spacers 250 may be on (e.g., in contact with) sidewalls of the upper gate G-U, such that the insulating spacers 250 are between the upper source/drain regions 150 and the sidewalls of the upper gate G-U. Some of the insulating spacers 250 may be between the upper semiconductor channel layers 120-U. Moreover, the insulating spacers 250 may contact the upper source/drain regions 150.

Aside from the locations of the insulating spacers 250 and the semiconductor spacers 260, and/or the locations of multi-layer source/drain regions (e.g., the layers L1-L4), the example cross-section shown in FIG. 2B may otherwise be the same as the example cross-section shown in FIG. 2A. Depending on the specifications of a transistor device 100 (FIG. 1), a transistor stack 101 may be structured either as shown in FIG. 2A or as shown in FIG. 2B. The transistor stacks 101U and 101L are thus different examples of the transistor stack 101.

Figure 3A:
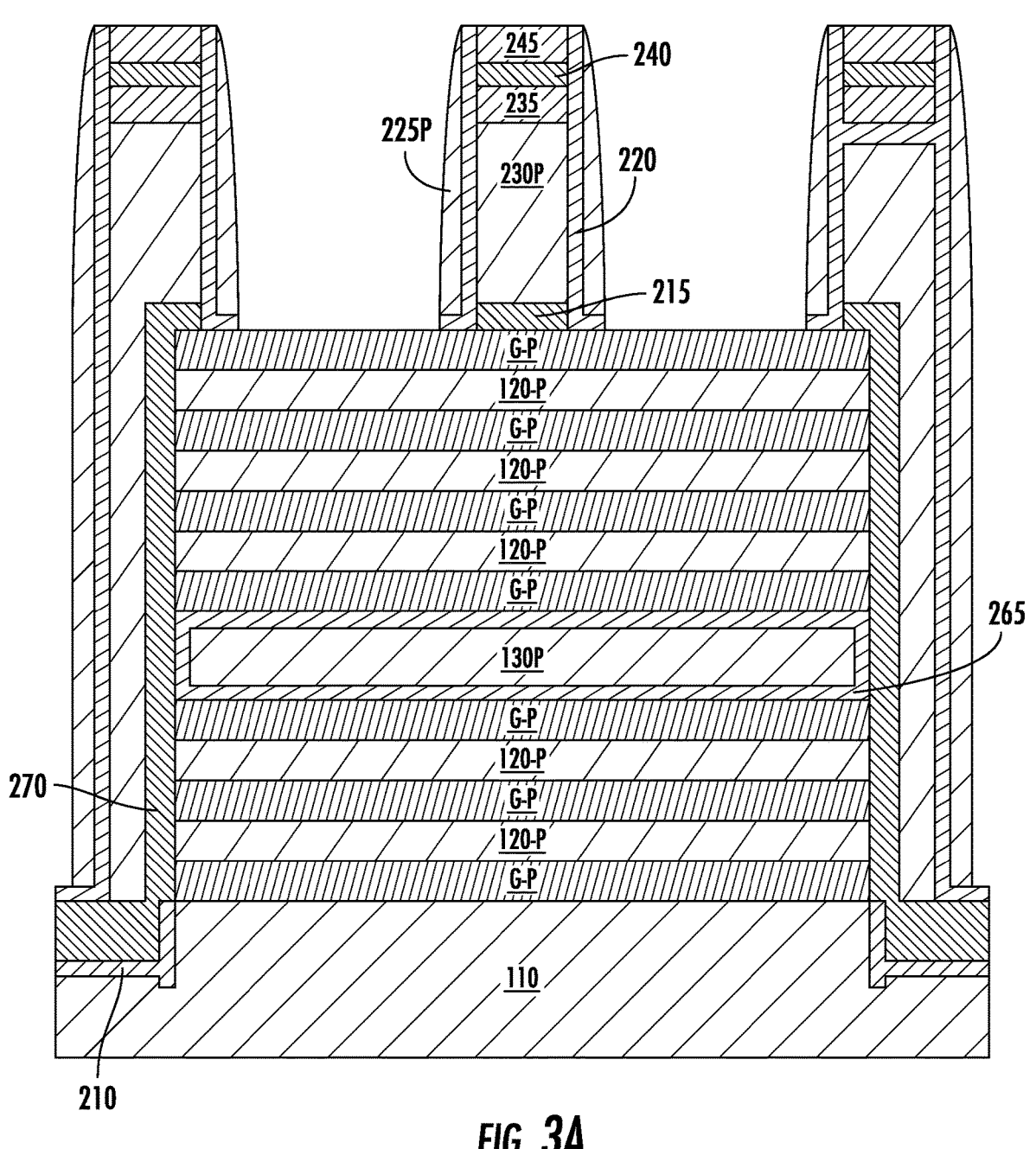
Figure 5A:
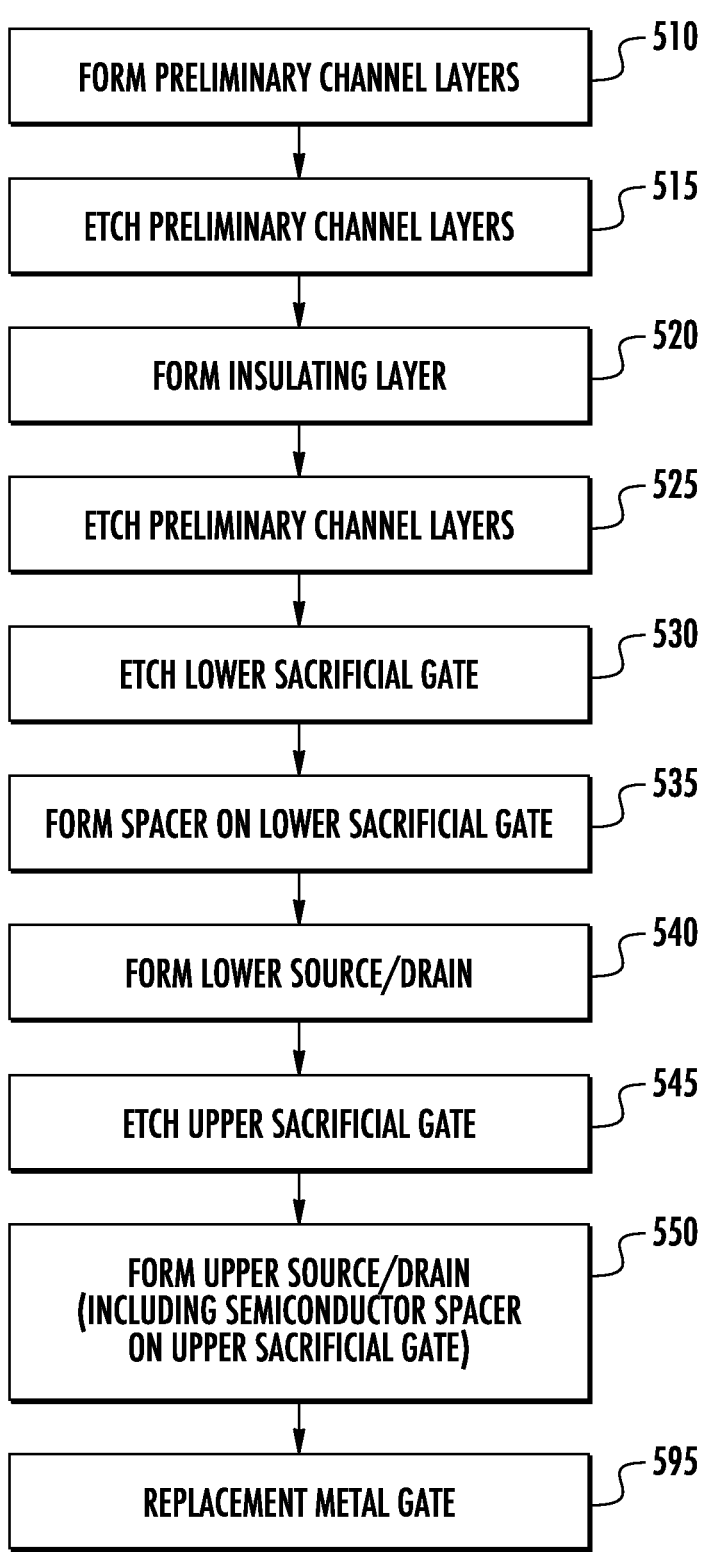
FIG. 5A is a flowchart corresponding to the operations shown in FIGS. 3A-3K.

FIGS. 3A-3K are cross-sectional views illustrating operations of forming the transistor stack 101U of FIG. 2A. FIG. 5A is a flowchart corresponding to the operations shown in FIGS. 3A-3K. As shown in FIGS. 3A and 5A, the operations may include forming (Block 510) preliminary channel layers 120-P on the substrate 110. The preliminary channel layers 120-P may be alternately stacked on the substrate 110 with sacrificial gate layers G-P.

The preliminary channel layers 120-P are semiconductor layers that comprise, for example, silicon. In a subsequent process/operation, the sacrificial gate layers G-P may be replaced with a metal gate. Moreover, a layer 230P that is on top of the sacrificial gate layers G-P may also be a sacrificial layer that will subsequently be replaced with metal. The sacrificial gate layers G-P and the layer 230P may comprise, for example, polysilicon or silicon germanium. A layer 215 that is under the layer 230P may also be a sacrificial layer that will subsequently be replaced with metal. According to some embodiments, the layers 215 and 230P may be a single layer (e.g., may comprise the same material) rather than two different layers.

In some embodiments, a preliminary spacer 130P may be between upper ones of the sacrificial gate layers G-P and lower ones of the sacrificial gate layers G-P. An insulating layer 265 may be on upper and lower surfaces of the preliminary spacer 130P. According to some embodiments, a layer 210 may be in a recess of the substrate 110, and the insulating layer 270 may be in the recess and on sidewalls of the preliminary channel layers 120-P and sidewalls of the sacrificial gate layers G-P. The layers 215, 220, 230P, 235, 240, and 245 may be between a pair of preliminary spacers 225P on top of an uppermost one of the sacrificial gate layers G-P.

Figure 3B:
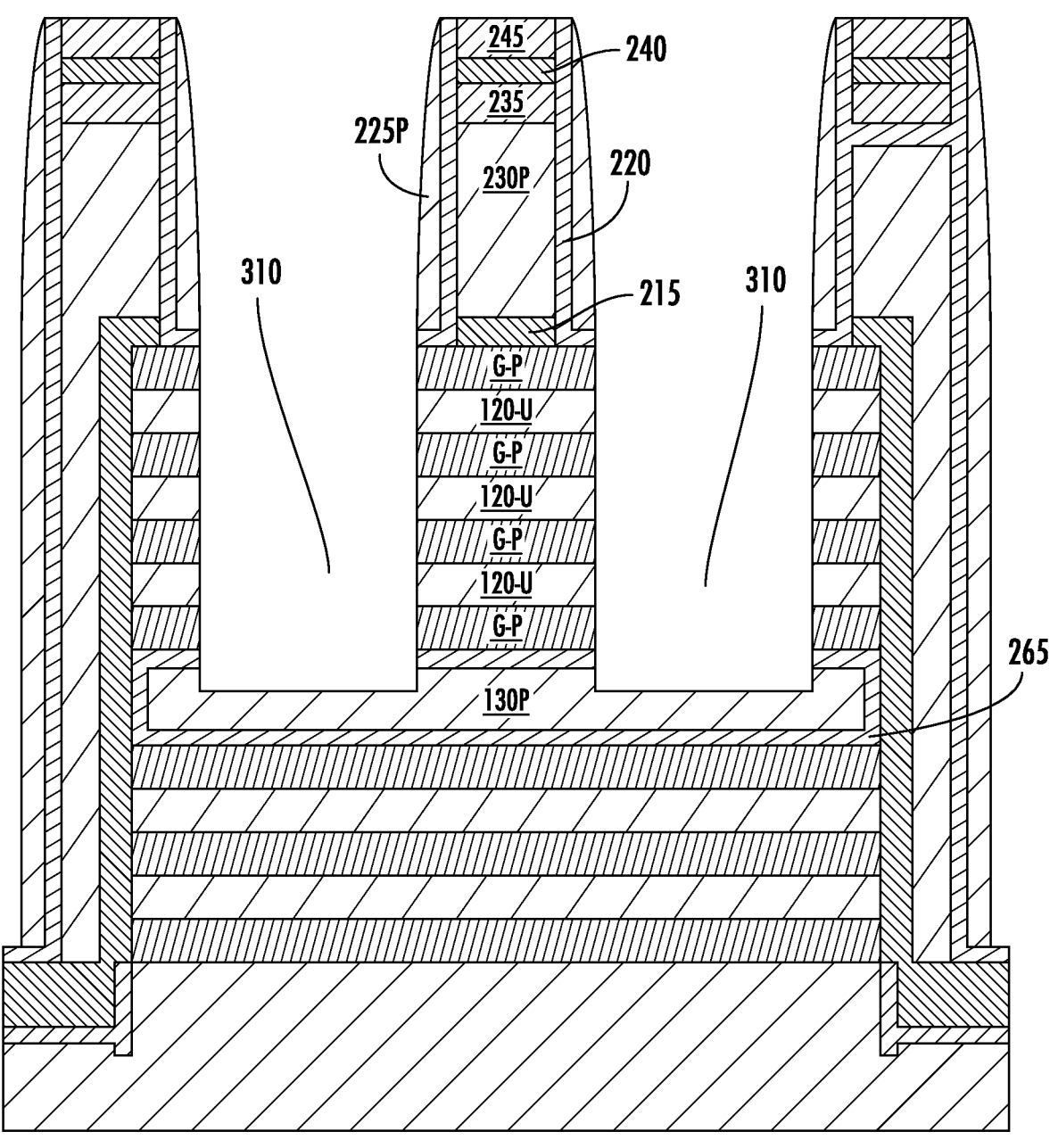

As shown in FIGS. 3B and 5A, upper ones of the preliminary channel layers 120-P and upper ones of the sacrificial gate layers G-P may be etched (Block 515) while using the layers 235, 240, and 245 and the preliminary spacers 225P as an etch mask. As a result, openings 310 may be formed in the upper ones of the preliminary channel layers 120-P and the upper ones of the sacrificial gate layers G-P. For example, upper semiconductor channel layers 120-U may be formed by the etching. According to some embodiments, the preliminary spacer 130P may serve as an etch stop layer that protects lower ones of the preliminary channel layers 120-P and lower ones of the sacrificial gate layers G-P from etching.

Figure 3C:
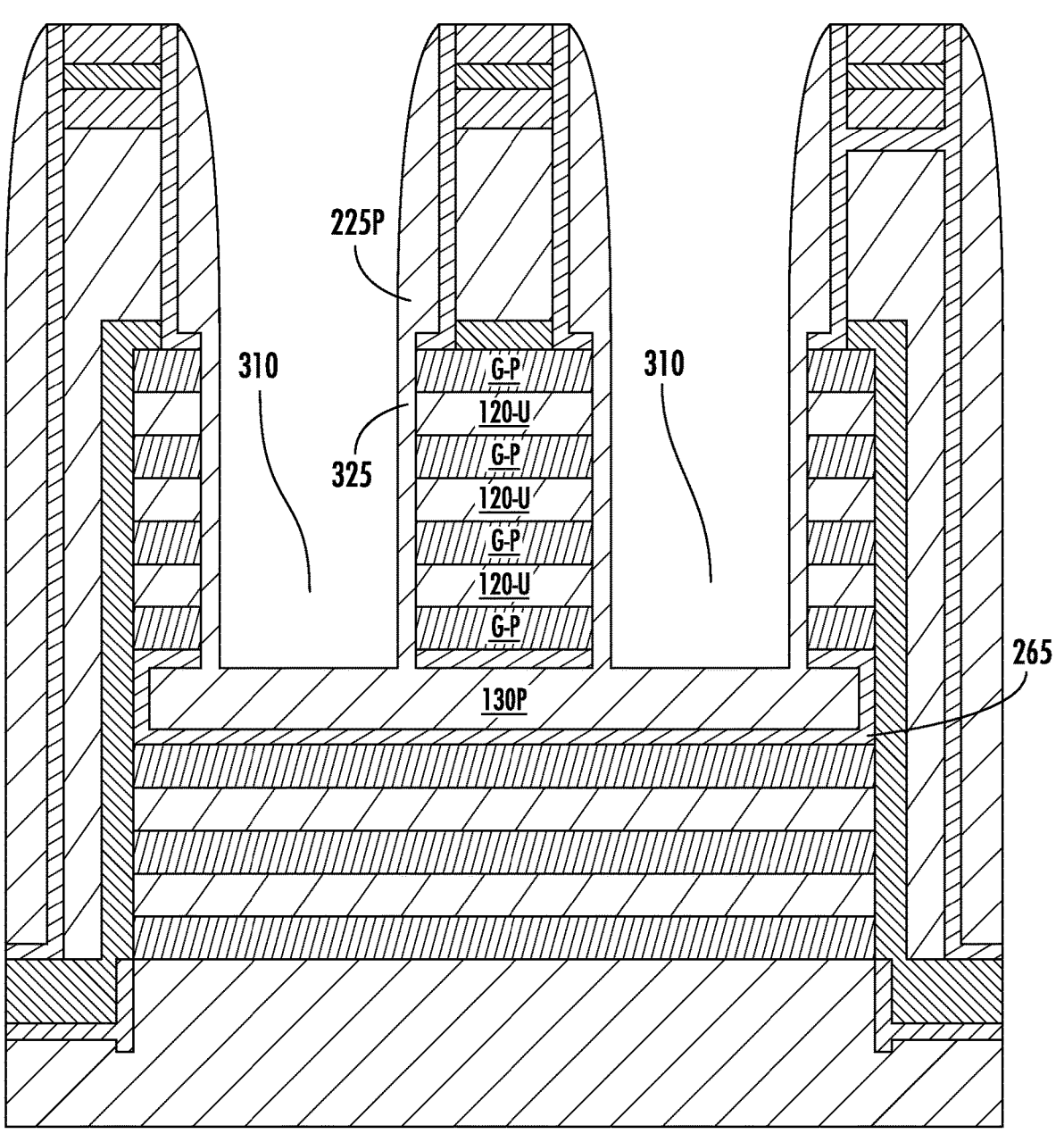

As shown in FIGS. 3C and 5A, an insulating layer 325 may be conformally formed (Block 520) in the openings 310 and on sidewalls of the preliminary spacers 225P. For example, the insulating layer 325 may include the same insulating material as the preliminary spacers 225P (and/or the same insulating material as the preliminary spacer 130P). Accordingly, a thickness of the preliminary spacers 225P may be increased by forming the insulating layer 325. Moreover, the insulating layer 325 may cover sidewalls of the upper semiconductor channel layers 120-U and sidewalls of the upper ones of the sacrificial gate layers G-P.

Figure 3D:
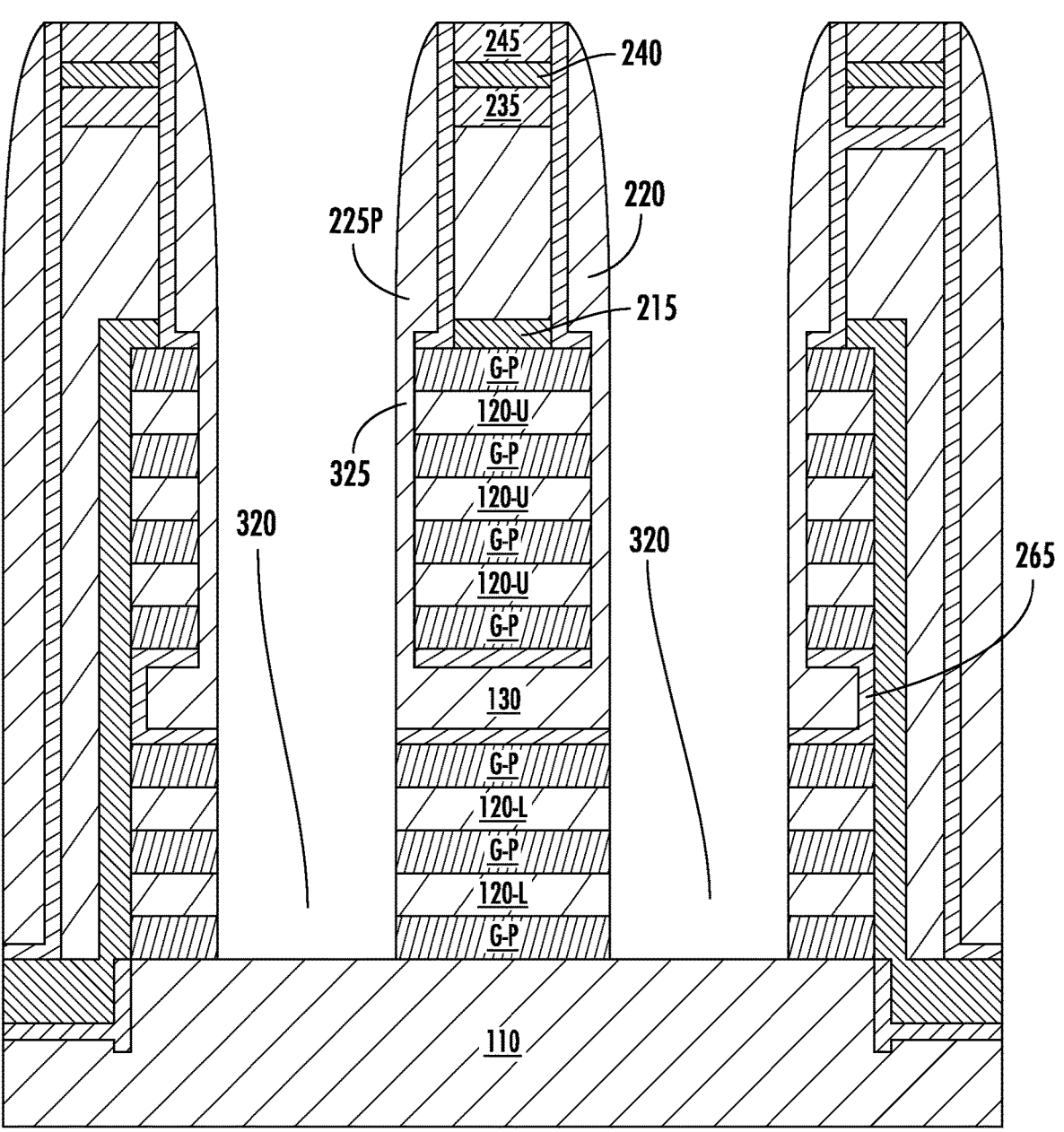

As shown in FIGS. 3D and 5A, lower ones of the preliminary channel layers 120-P and lower ones of the sacrificial gate layers G-P may be etched (Block 525) while using the layers 235, 240, and 245 and the widened preliminary spacers 225P (along with the insulating layer 325) as an etch mask. As a result, openings 320 may be formed in the lower ones of the preliminary channel layers 120-P and the lower ones of the sacrificial gate layers G-P. For example, lower semiconductor channel layers 120-L may be formed by the etching. The upper semiconductor channel layers 120-U and the upper ones of the sacrificial gate layers G-P, however, may be protected from etching by the insulating layer 325 that covers sidewalls thereof. Moreover, by etching through the preliminary spacer 130P (FIG. 3C), the spacer 130 may be formed between the upper semiconductor channel layers 120-U and the lower semiconductor channel layers 120-L.

Figure 3E:
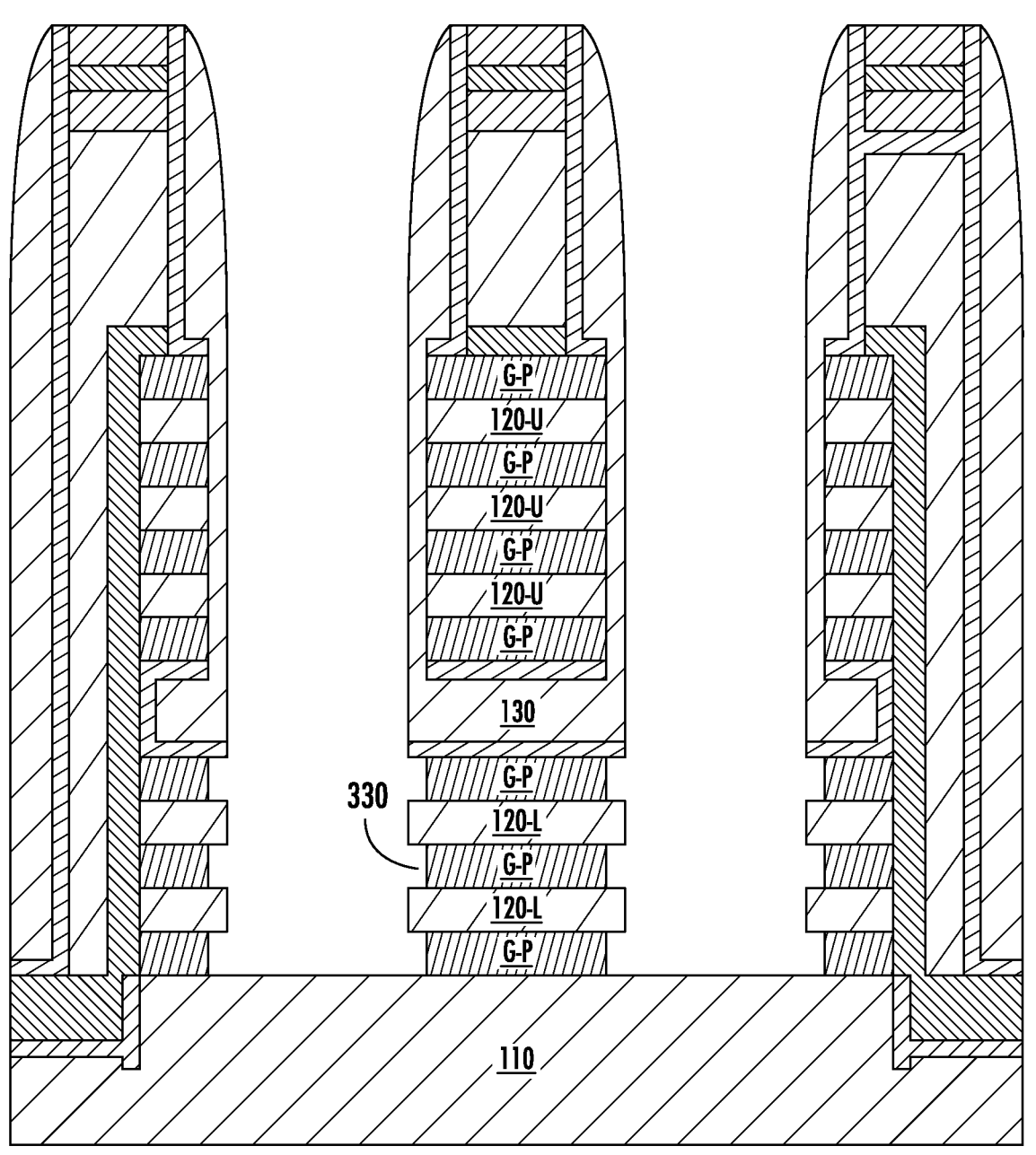

As shown in FIGS. 3E and 5A, sidewalls of the lower ones of the sacrificial gate layers G-P may be etched (Block 530) to form openings 330 (e.g., recesses) between the lower semiconductor channel layers 120-L. Accordingly, the lower ones of the sacrificial gate layers G-P may be narrowed, in the direction X (FIG. 2A), relative to the lower semiconductor channel layers 120-L. For example, the lower semiconductor channel layers 120-L may comprise a total of two semiconductor channel layers 120, and two (e.g., one right and one left) openings 330 may be between those two semiconductor channel layers 120. Moreover, two openings 330 may be between the substrate 110 and the lower one of those two semiconductor channel layers 120, and two openings 330 may be between the spacer 130 and the upper one of those two semiconductor channel layers 120.

Figure 3F:
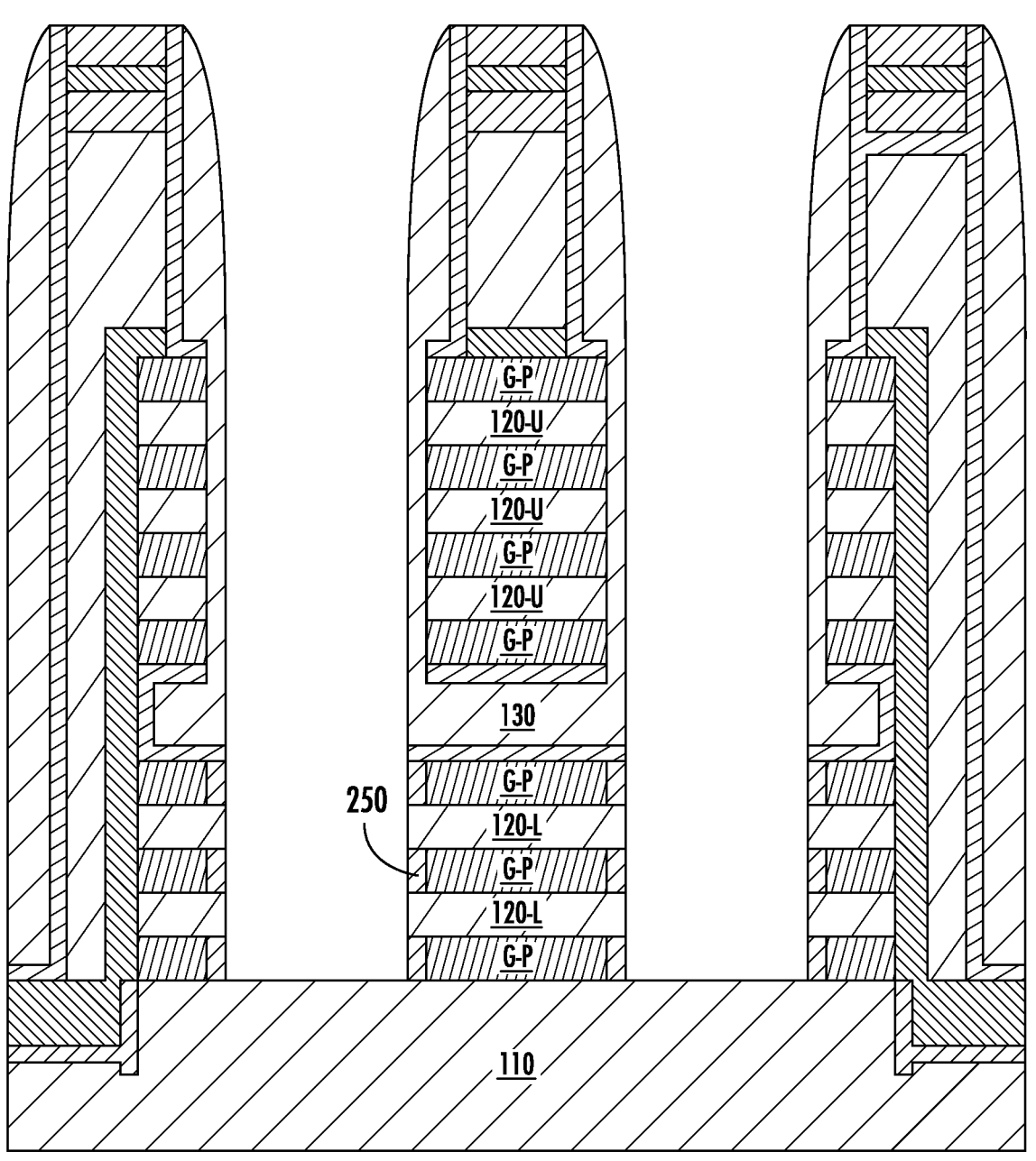

As shown in FIGS. 3F and 5A, insulating spacers 250 may be formed (Block 535) in the openings 330 (FIG. 3E), respectively. Accordingly, the insulating spacers 250 may be formed on sidewalls of the lower ones of the sacrificial gate layers G-P, such as by deposition of an insulating material on sidewalls of the lower ones of the sacrificial gate layers G-P that are exposed by the openings 330. As an example, each of the lower ones of the sacrificial gate layers G-P may be between, in the direction X (FIG. 2A), a pair of the insulating spacers 250. For example, each of the lower ones of the sacrificial gate layers G-P may have opposite sidewalls that contact respective ones of the insulating spacers 250. In some embodiments, the insulating spacers 250 may comprise nitrogen (e.g., silicon nitride).

Figure 3G:
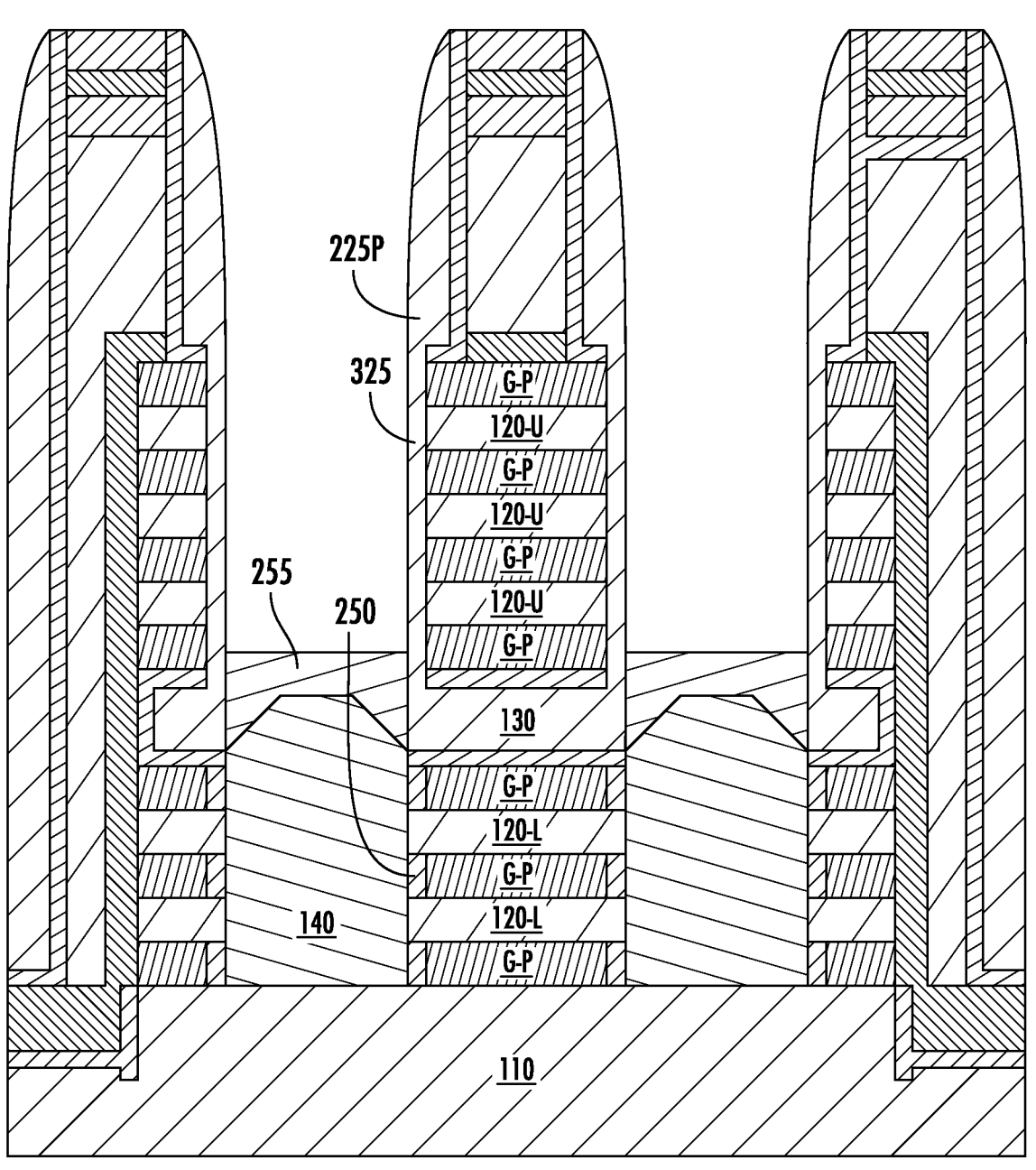

As shown in FIGS. 3G and 5A, lower source/drain regions 140 may be formed (Block 540) on the insulating spacers 250 and on sidewalls of the lower semiconductor channel layers 120-L. For example, the lower source/drain regions 140 may be epitaxially grown from the lower semiconductor channel layers 120-L. In some embodiments, the lower semiconductor channel layers 120-L may comprise silicon, and the lower source/drain regions 140 may comprise silicon, silicon carbide, or silicon germanium.

Moreover, an insulating layer 255 may be formed on top of the lower source/drain regions 140. The insulating layer 255 may electrically isolate the lower source/drain regions 140 from upper source/drain regions 150 (FIG. 3K) that will subsequently be formed.

Figure 3H:
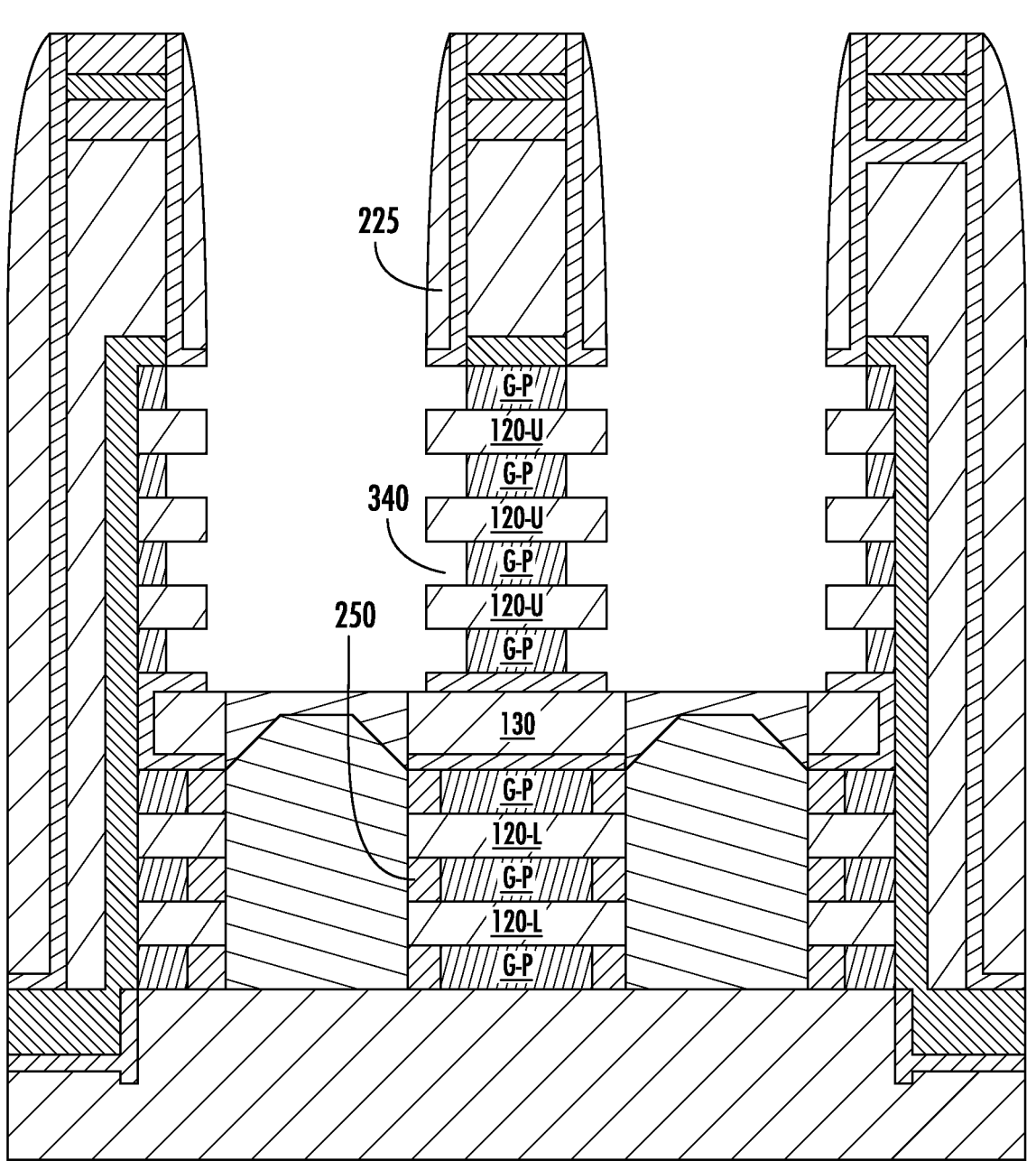
Figure 31:
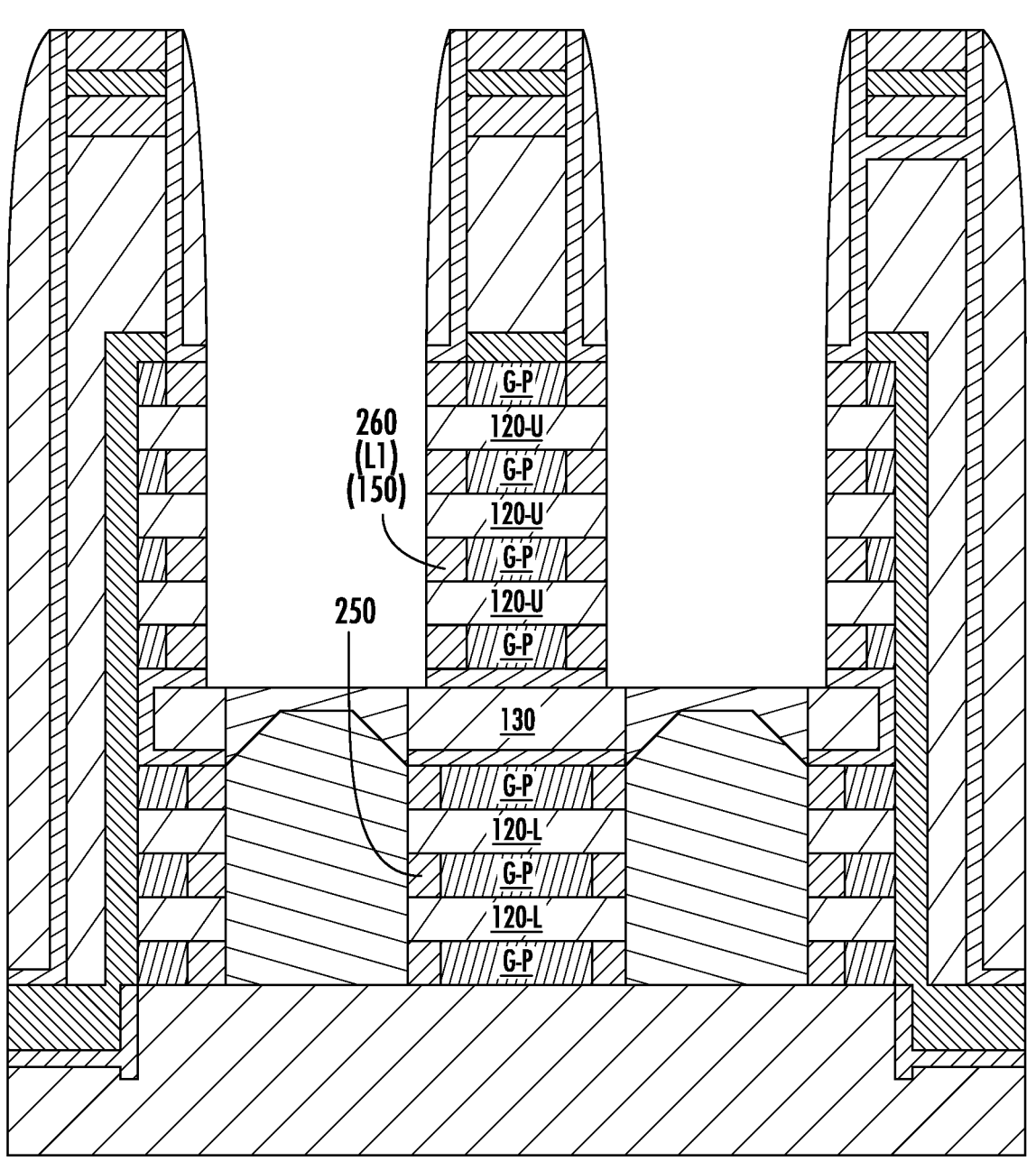

As shown in FIGS. 3H and 5A, sidewalls of the upper ones of the sacrificial gate layers G-P may be etched (Block 545) to form openings 340 (e.g., recesses) between the upper semiconductor channel layers 120-U. Accordingly, the upper ones of the sacrificial gate layers G-P may be narrowed, in the direction X (FIG. 2A), relative to the upper semiconductor channel layers 120-U.

Moreover, to expose sidewalls of the upper ones of the sacrificial gate layers G-P before etching those sidewalls, the insulating layer 325 (FIG. 3G) that is on those sidewalls may be removed. The preliminary spacers 225P (FIG. 3G) may also be thinned/narrowed, thereby providing the spacers 225. In some embodiments, two openings 340 may be between the spacers 225 and an uppermost one of the upper semiconductor channel layers 120-U, and two openings 340 may be between the spacer 130 and a lowermost one of the upper semiconductor channel layers 120-U.

As shown in FIGS. 3I and 5A, semiconductor spacers 260 may be formed (Block 550) in the openings 340 (FIG. 3H), respectively. Accordingly, the semiconductor spacers 260 may be formed on sidewalls of the upper ones of the sacrificial gate layers G-P. As an example, each of the upper ones of the sacrificial gate layers G-P may be between, in the direction X (FIG. 2A), a pair of the semiconductor spacers 260. For example, each of the upper ones of the sacrificial gate layers G-P may have opposite sidewalls that contact respective ones of the semiconductor spacers 260.

In some embodiments, the semiconductor spacers 260 may be epitaxially grown from the upper semiconductor channel layers 120-U (e.g., from upper and lower surfaces thereof). Moreover, the semiconductor spacers 260 may be part (e.g., a first semiconductor layer L1) of upper source/drain regions 150 that are epitaxially grown. The semiconductor spacers 260 comprise a different material from the insulating spacers 250. For example, the semiconductor spacers 260 may not include nitrogen, but rather may include silicon, silicon carbide, or silicon germanium.

Figure 3J:
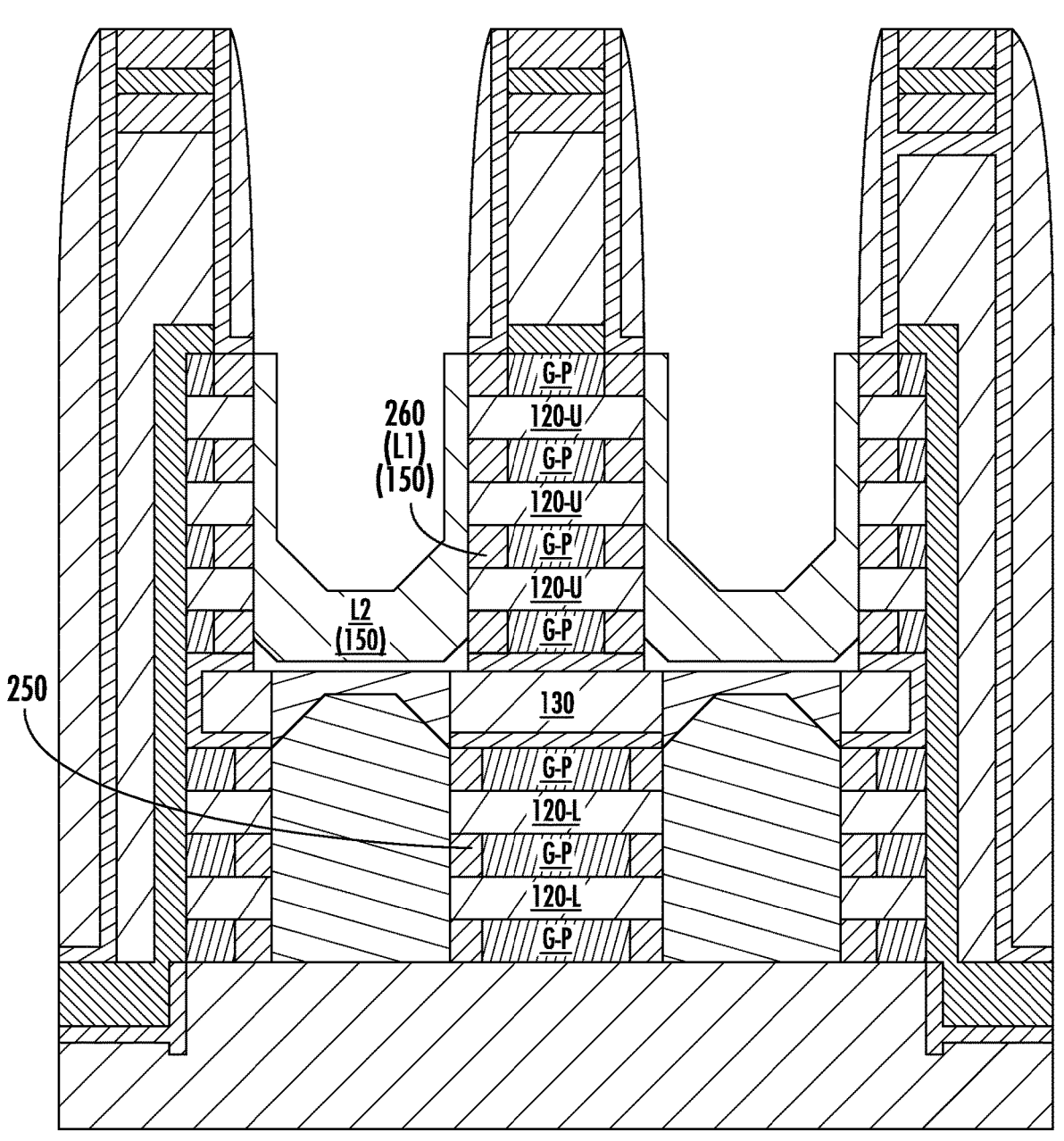

As shown in FIG. 3J, a second semiconductor layer L2 of the upper source/drain regions 150 may be epitaxially grown from the upper semiconductor channel layers 120-U (e.g., from sidewalls thereof) and from the first layer L1 (e.g., from sidewalls of the semiconductor spacers 260. In some embodiments, the second layer L2 may have a higher concentration of germanium than the first layer L1. For example, the first and second layers L1, L2 may comprise up to 5 atomic percent and up to 20 atomic percent, respectively, germanium.

Figure 3K:
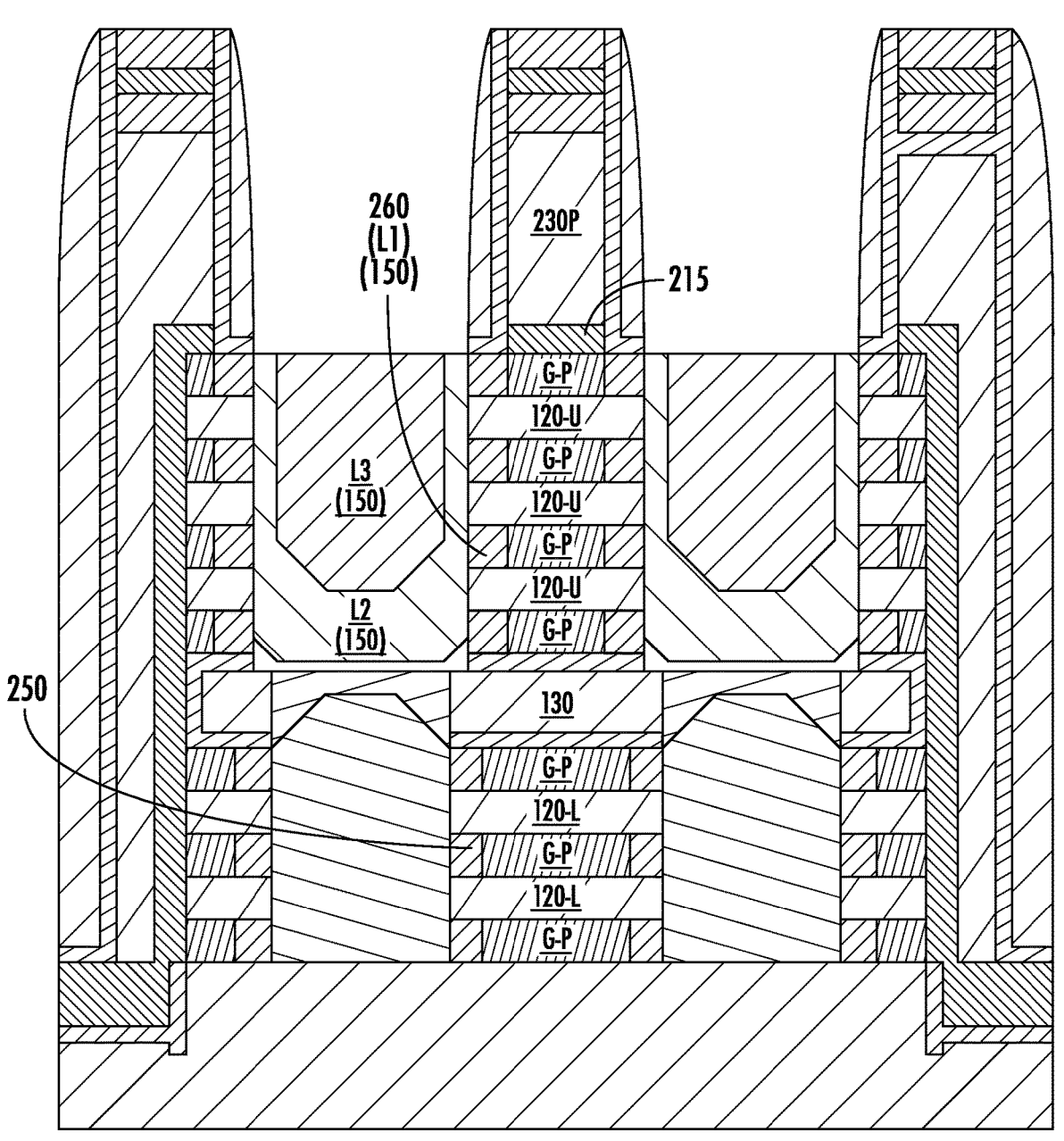

As shown in FIG. 3K, a third semiconductor layer L3 of the upper source/drain regions 150 may be formed between sidewalls of the second layer L2. According to some embodiments, the third layer L3 may have a higher concentration of (e.g., up to 55 atomic percent) germanium than the second layer L2. In other embodiments, the four layers L1-L4 may each have the same concentration of germanium.

As shown in FIG. 2A, a fourth semiconductor layer L4 of the upper source/drain regions 150 may be formed on top of the third layer L3. The fourth layer L4 may comprise, for example, up to 5 atomic percent germanium, and may protect the second and third layers L2, L3 from etching.

As shown in FIGS. 2A and 5A, upper and lower metal gates G-U, G-L may be formed (Block 595) after forming the upper source/drain regions 150. For example, a replacement metal gate process may be performed to replace the upper ones of the sacrificial gate layers G-P (e.g., silicon germanium) with the upper metal gate G-U, and to replace the lower ones of the sacrificial gate layers G-P with the lower metal gate G-L. Moreover, gate insulation layers may be formed between the upper metal gate G-U and the upper semiconductor channel layers 120-U, and between the lower metal gate G-L and the lower semiconductor channel layers 120-L. Also, the layers 215, 230P that are on top of the sacrificial gate layers G-P may be sacrificial layers (e.g., polysilicon) that are replaced with metal to form an upper portion of the upper metal gate G-U during the replacement metal gate process.

FIGS. 4A-4J are cross-sectional views illustrating operations of forming the transistor stack 101L of FIG. 2B. FIG. 5B is a flowchart corresponding to the operations shown in FIGS. 4A-4J. The operations shown in FIGS. 4A-4J may occur after performing the operations that are shown in Blocks 510 and 515 and FIGS. 3A and 3B.

Figure 4A:
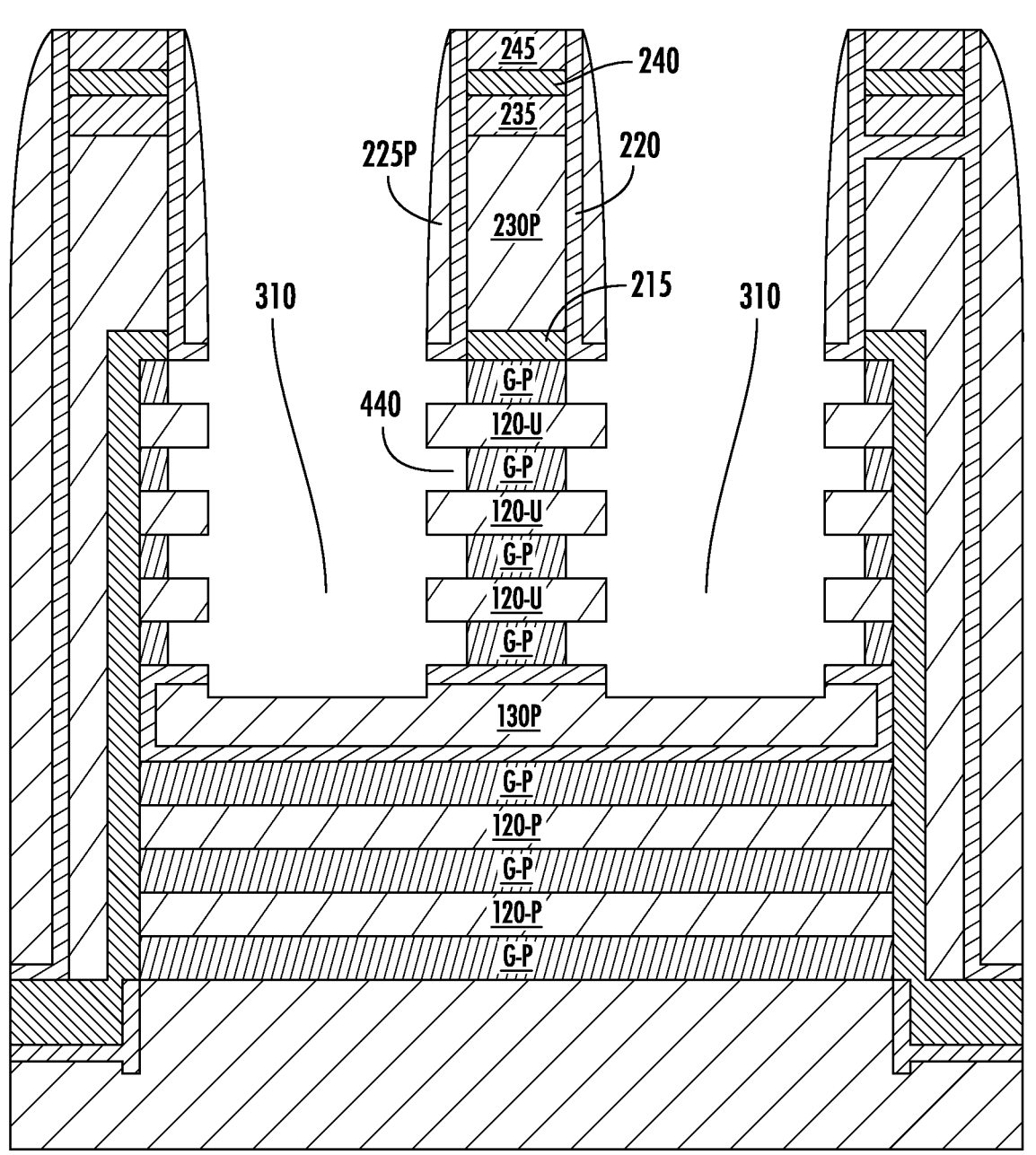
FIGS. 4A-4J are cross-sectional views illustrating operations of forming the transistor stack of FIG. 2B.

As shown in FIGS. 4A and 5B, sidewalls of the upper ones of the sacrificial gate layers G-P may be etched (Block 555) to form openings 440 (e.g., recesses) between the upper semiconductor channel layers 120-U. Accordingly, the upper ones of the sacrificial gate layers G-P may be narrowed, in the direction X (FIG. 2A), relative to the upper semiconductor channel layers 120-U.

Figure 4B:
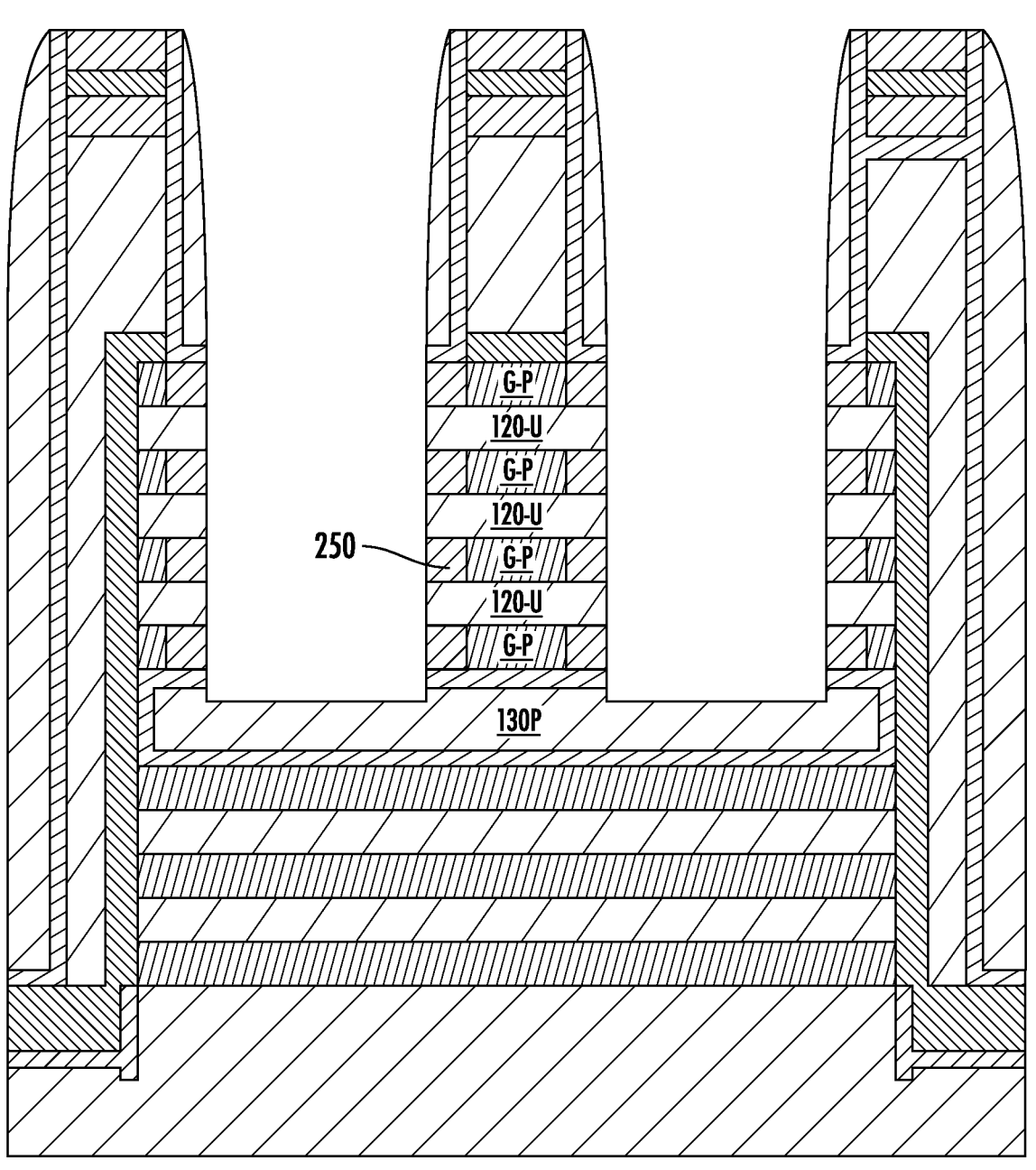

As shown in FIGS. 4B and 5B, insulating spacers 250 may be formed (Block 560) in the openings 440 (FIG. 4A), respectively. Accordingly, the insulating spacers 250 may be formed on sidewalls of the upper ones of the sacrificial gate layers G-P, such as by deposition of an insulating material on sidewalls of the upper ones of the sacrificial gate layers G-P that are exposed by the openings 440. As an example, each of the upper ones of the sacrificial gate layers G-P may be between, in the direction X (FIG. 2A), a pair of the insulating spacers 250. For example, each of the upper ones of the sacrificial gate layers G-P may have opposite sidewalls that contact respective ones of the insulating spacers 250.

Figure 4C:
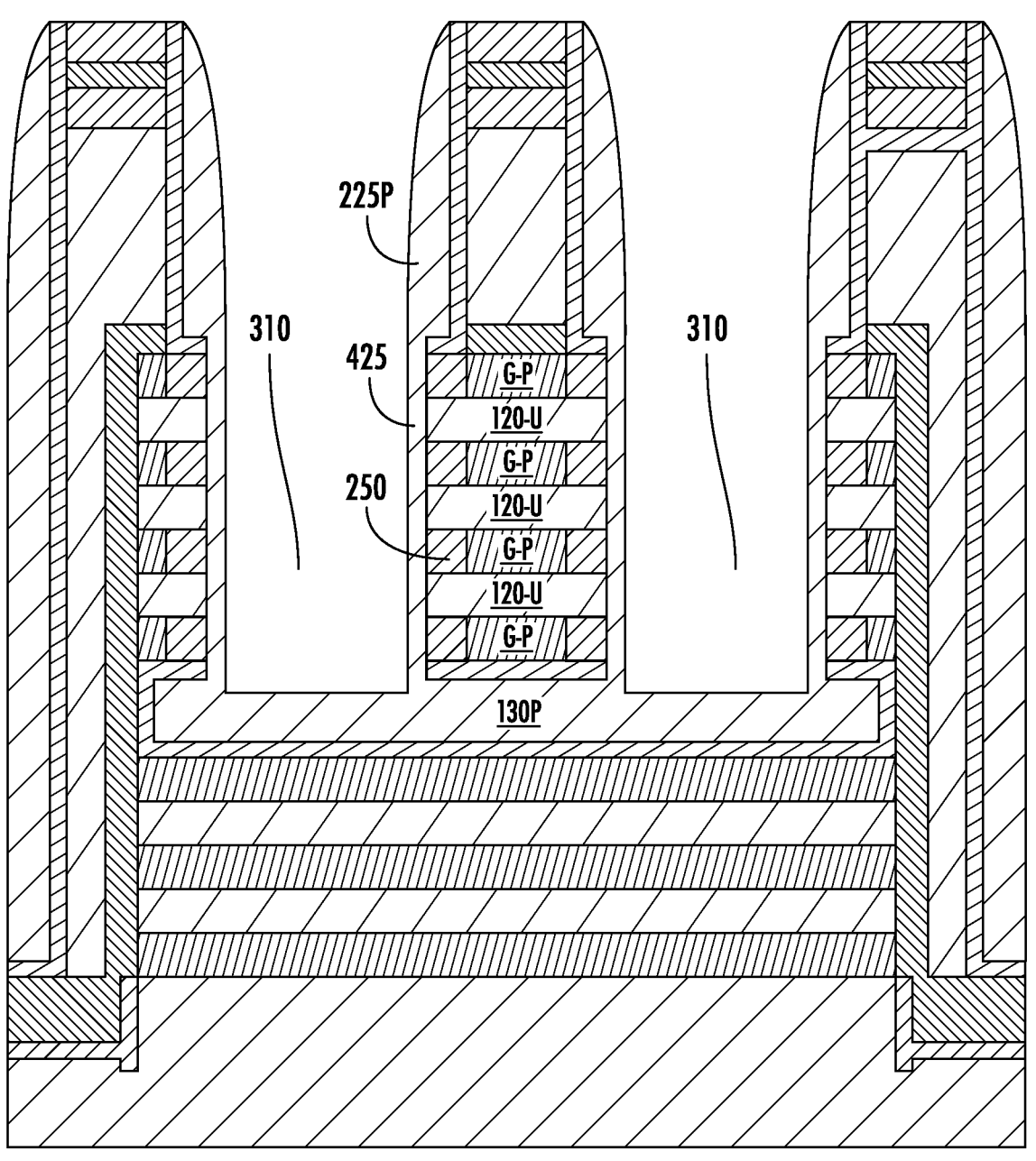

As shown in FIGS. 4C and 5B, an insulating layer 425 may be conformally formed (Block 565) in the openings 310 and on sidewalls of the preliminary spacers 225P. For example, the insulating layer 425 may include the same insulating material as the preliminary spacers 225P (and/or the same insulating material as the preliminary spacer 130P). Accordingly, a thickness of the preliminary spacers 225P may be increased by forming the insulating layer 425. Moreover, the insulating layer 425 may cover sidewalls of the upper semiconductor channel layers 120-U and sidewalls of the insulating spacers 250.

Figure 4D:
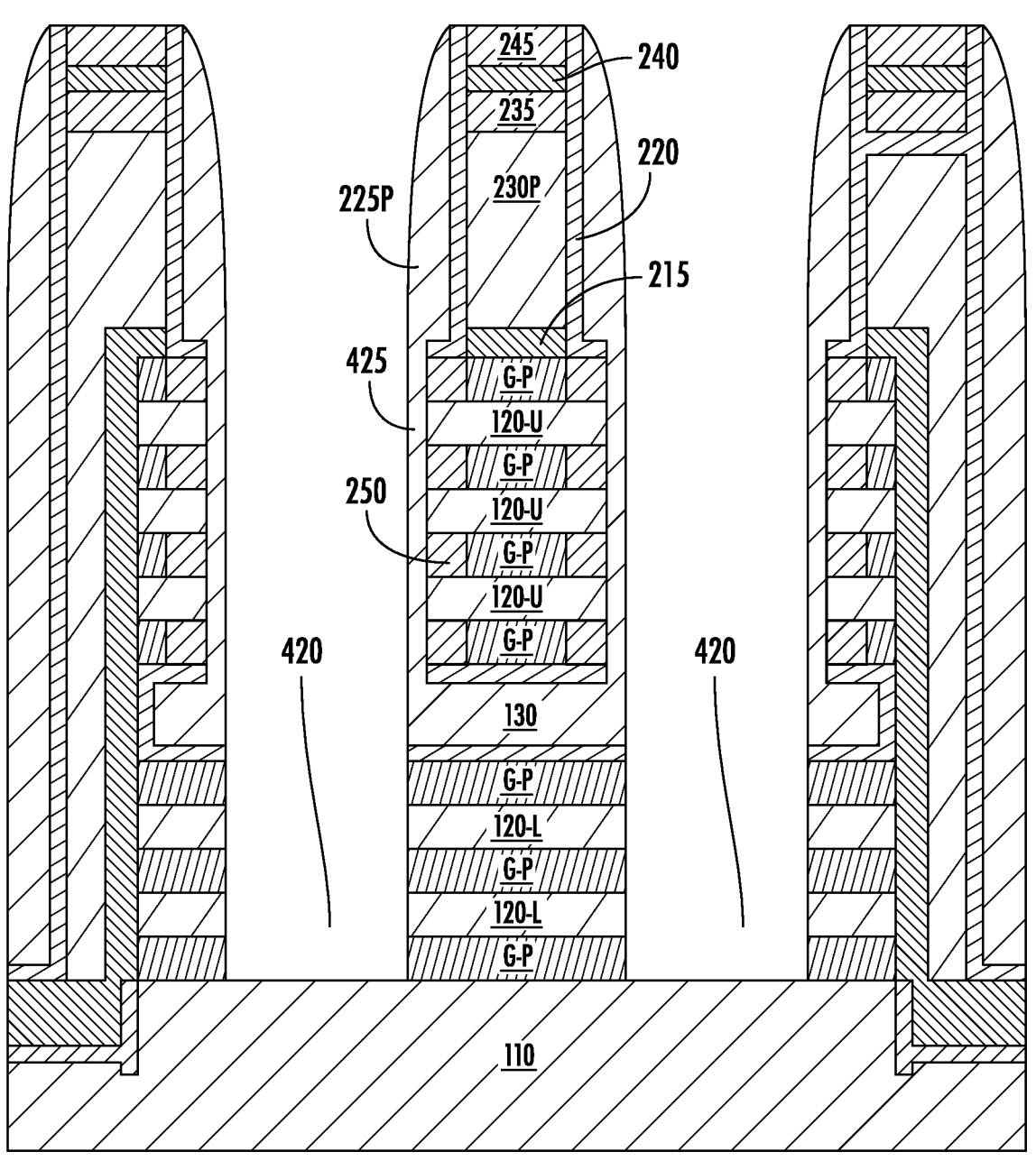

As shown in FIGS. 4D and 5B, lower ones of the preliminary channel layers 120-P and lower ones of the sacrificial gate layers G-P may be etched (Block 570) while using the layers 235, 240, and 245 and the widened preliminary spacers 225P (along with the insulating layer 425) as an etch mask. As a result, openings 420 may be formed in the lower ones of the preliminary channel layers 120-P and the lower ones of the sacrificial gate layers G-P. For example, lower semiconductor channel layers 120-L may be formed by the etching. The upper semiconductor channel layers 120-U and the insulating spacers 250, however, may be protected from etching by the insulating layer 425 that covers sidewalls thereof. Moreover, by etching through the preliminary spacer 130P (FIG. 4C), the spacer 130 may be formed between the upper semiconductor channel layers 120-U and the lower semiconductor channel layers 120-L.

Figure 4E:
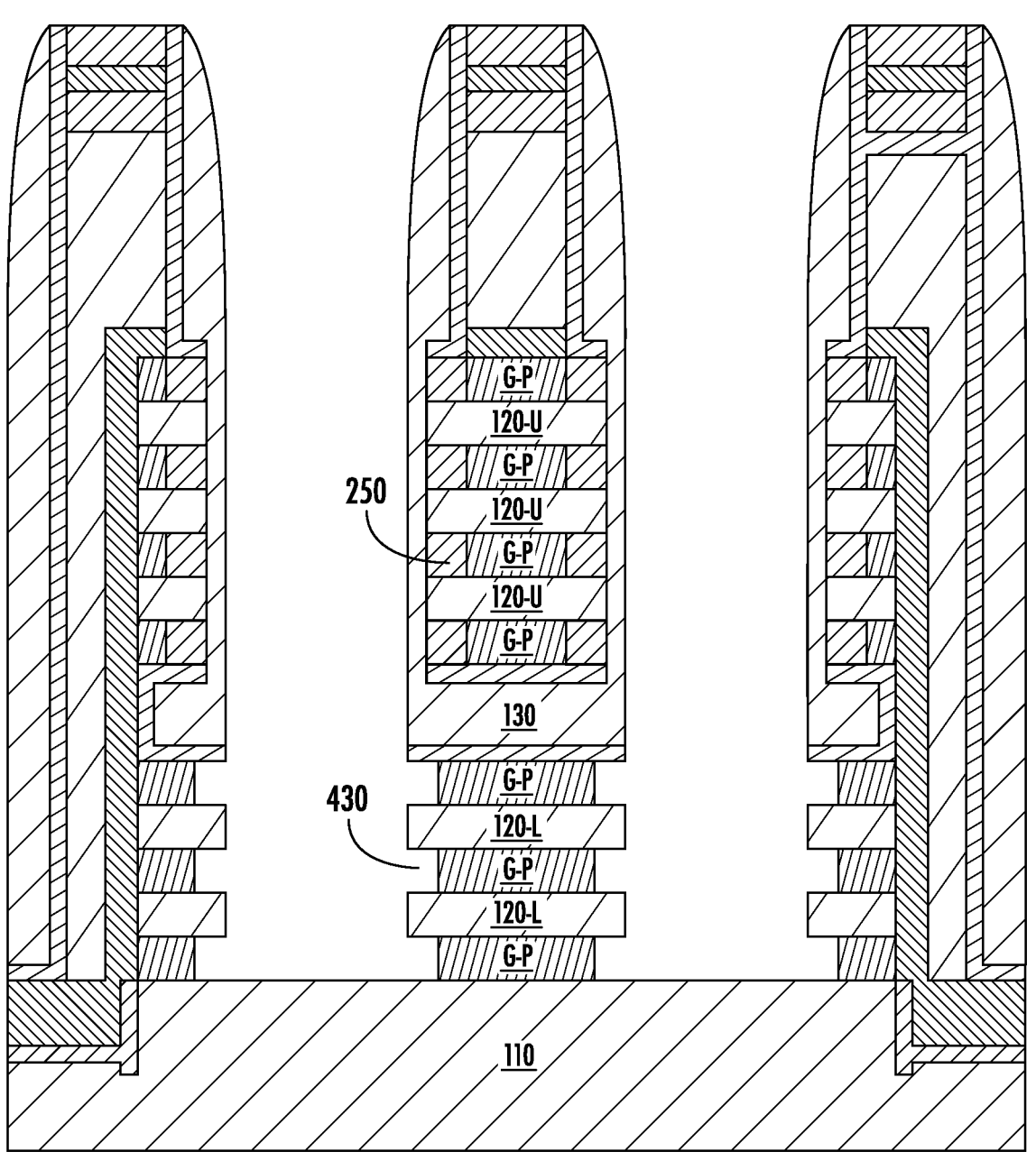

As shown in FIGS. 4E and 5B, sidewalls of the lower ones of the sacrificial gate layers G-P may be etched (Block 575) to form openings 430 (e.g., recesses) between the lower semiconductor channel layers 120-L. Accordingly, the lower ones of the sacrificial gate layers G-P may be narrowed, in the direction X (FIG. 2A), relative to the lower semiconductor channel layers 120-L. For example, the lower semiconductor channel layers 120-L may comprise a total of two semiconductor channel layers 120, and two (e.g., one right and one left) openings 430 may be between those two semiconductor channel layers 120. Moreover, two openings 430 may be between the substrate 110 and the lowermost one of the lower semiconductor channel layers 120-L, and two openings 430 may be between the spacer 130 and the uppermost one of the lower semiconductor channel layers 120-L.

Figure 4F:
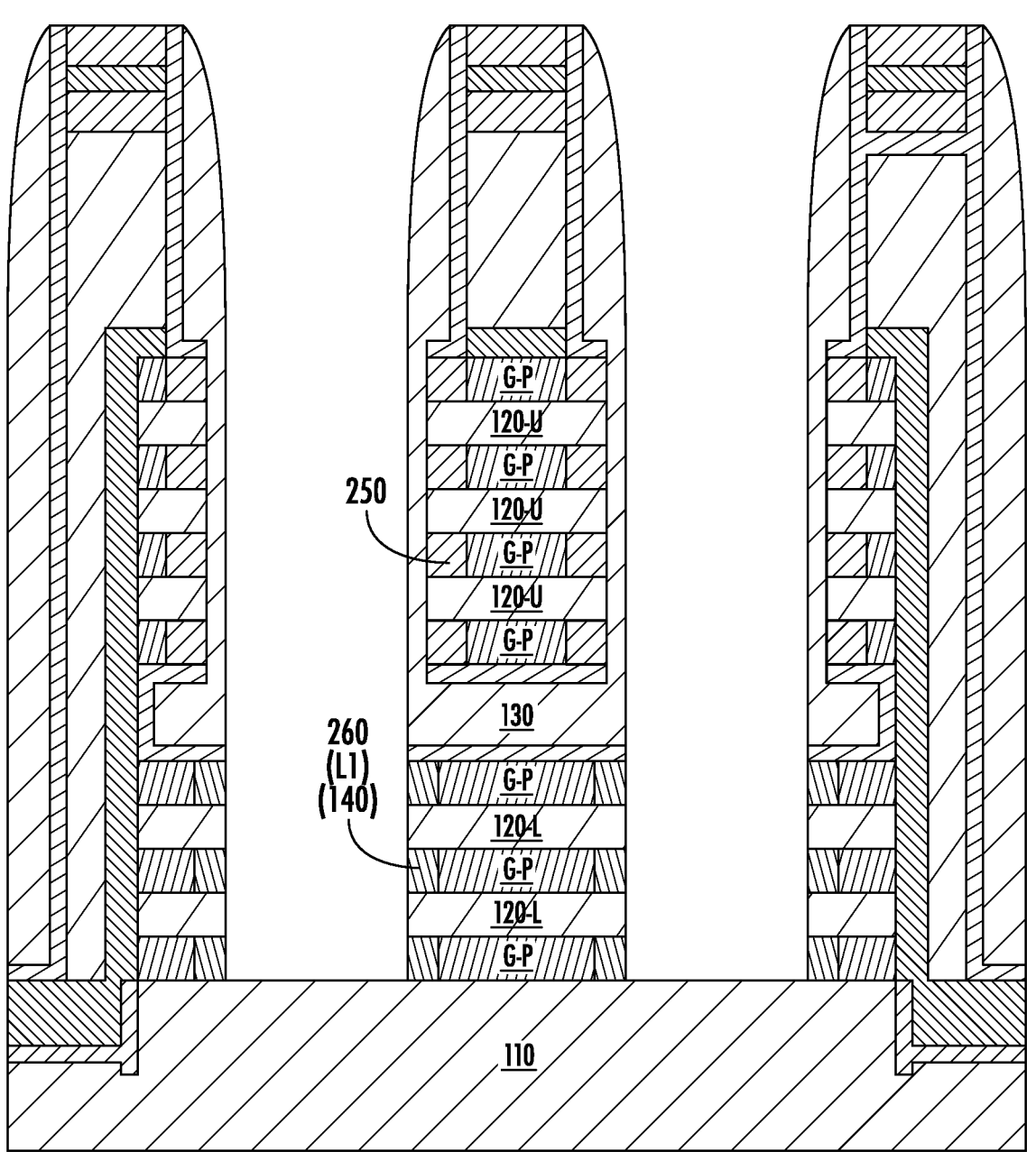

As shown in FIGS. 4F and 5B, semiconductor spacers 260 may be formed (Block 580) in the openings 430 (FIG. 4E), respectively. Accordingly, the semiconductor spacers 260 may be formed on sidewalls of the lower ones of the sacrificial gate layers G-P. As an example, each of the lower ones of the sacrificial gate layers G-P may be between, in the direction X (FIG. 2A), a pair of the semiconductor spacers 260. For example, each of the lower ones of the sacrificial gate layers G-P may have opposite sidewalls that contact respective ones of the semiconductor spacers 260.

In some embodiments, the semiconductor spacers 260 may be epitaxially grown from the lower semiconductor channel layers 120-L (e.g., from upper and lower surfaces thereof). As an example, the semiconductor spacers 260 may be part (e.g., a first semiconductor layer L1) of lower source/drain regions 140 that are epitaxially grown. Moreover, the semiconductor spacers 260 comprise a different material from the insulating spacers 250. For example, the semiconductor spacers 260 may not include nitrogen, but rather may include silicon carbide or silicon germanium.

Figure 4G:
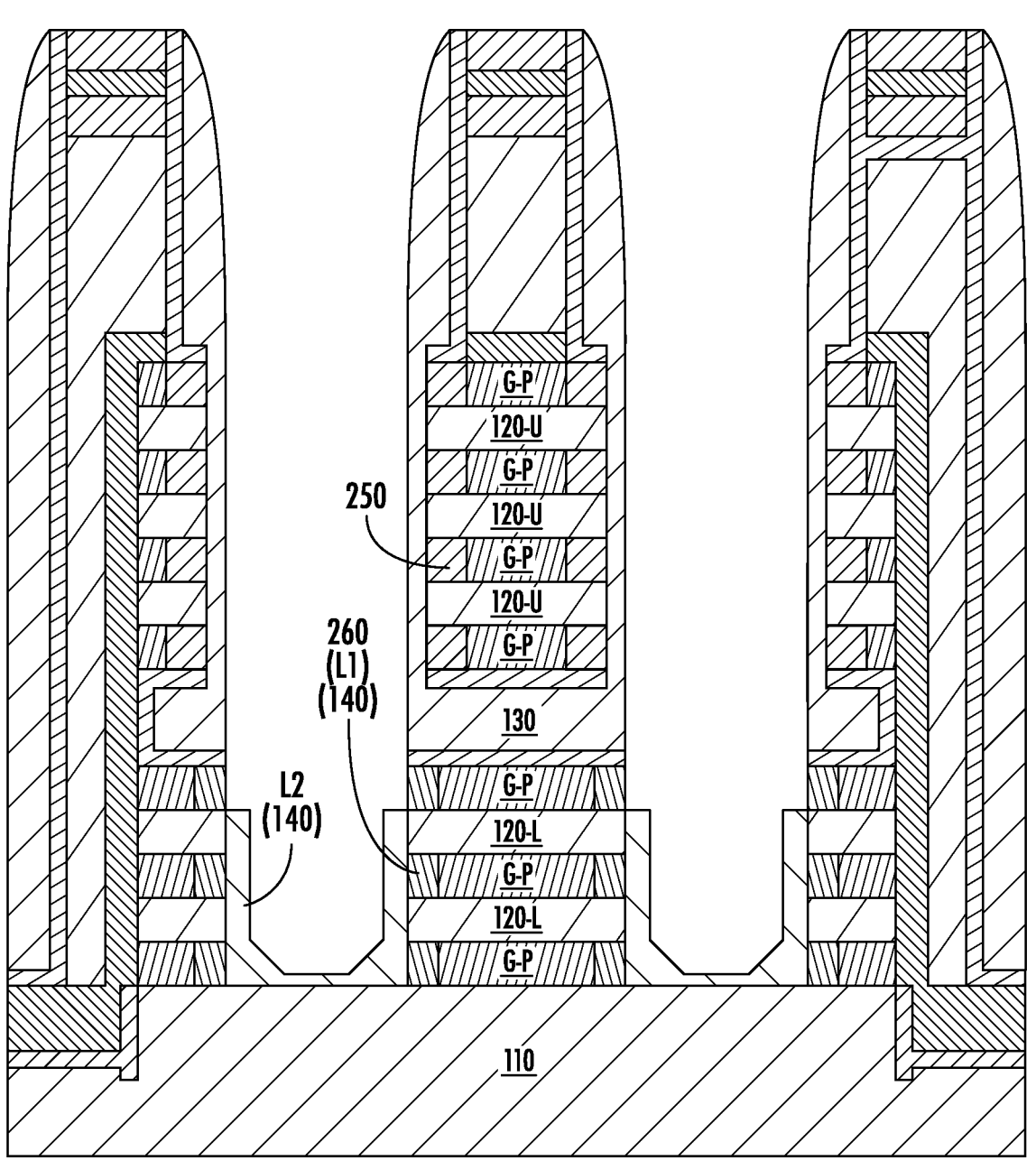

As shown in FIG. 4G, a second semiconductor layer L2 of the lower source/drain regions 140 may be epitaxially grown from the lower semiconductor channel layers 120-L (e.g., from sidewalls thereof) and from the first layer L1 (e.g., from sidewalls of the semiconductor spacers 260. Accordingly, the second layer L2 may be on the sidewalls of the lower semiconductor channel layers 120-L and on sidewalls of the semiconductor spacers 260.

Figure 4H:
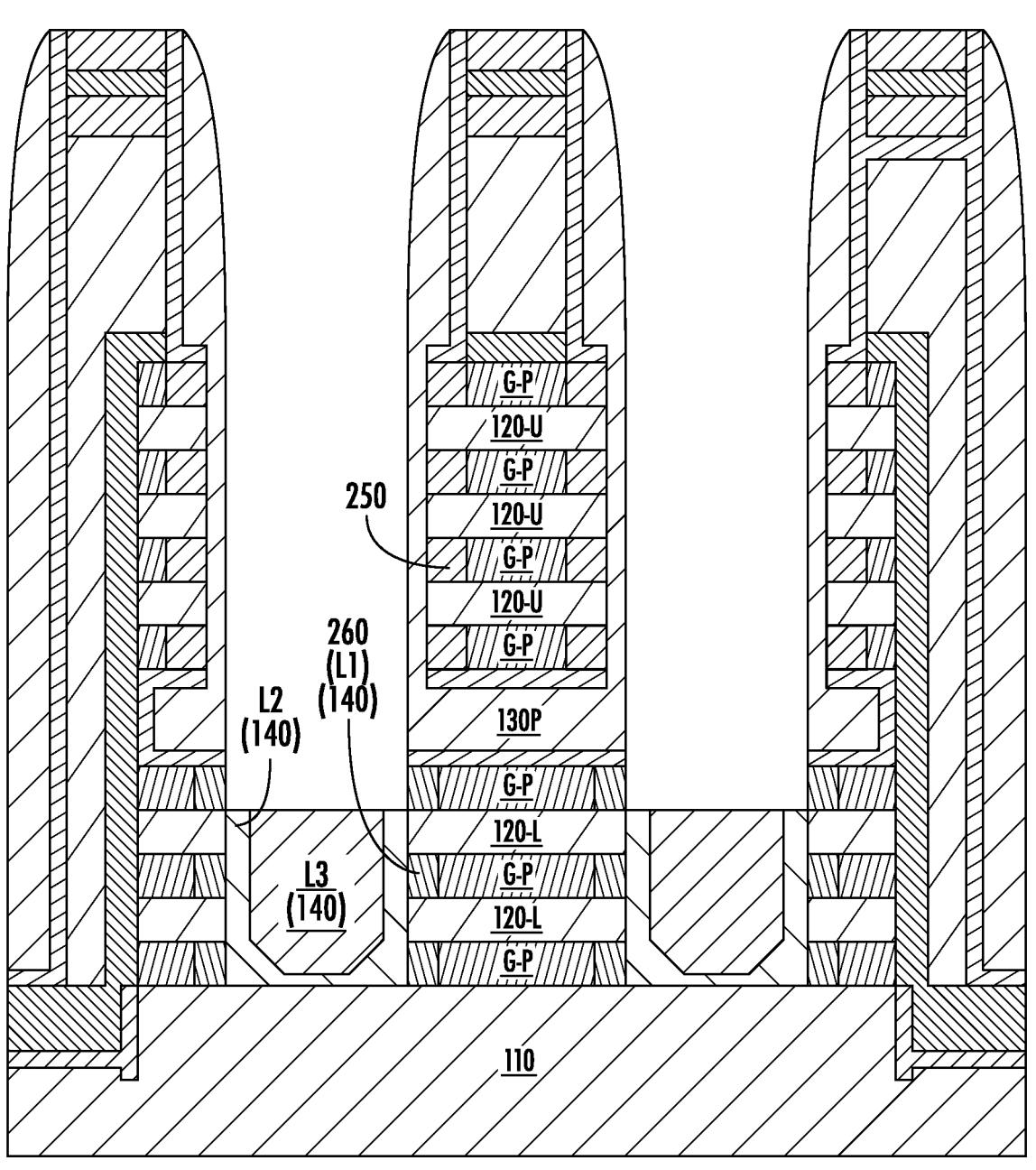

As shown in FIG. 4H, a third semiconductor layer L3 of the lower source/drain regions 140 may be formed between sidewalls of the second layer L2. In some embodiments, an upper surface of the third layer L3 may be coplanar with an upper surface of the second layer L2.

Figure 4I:
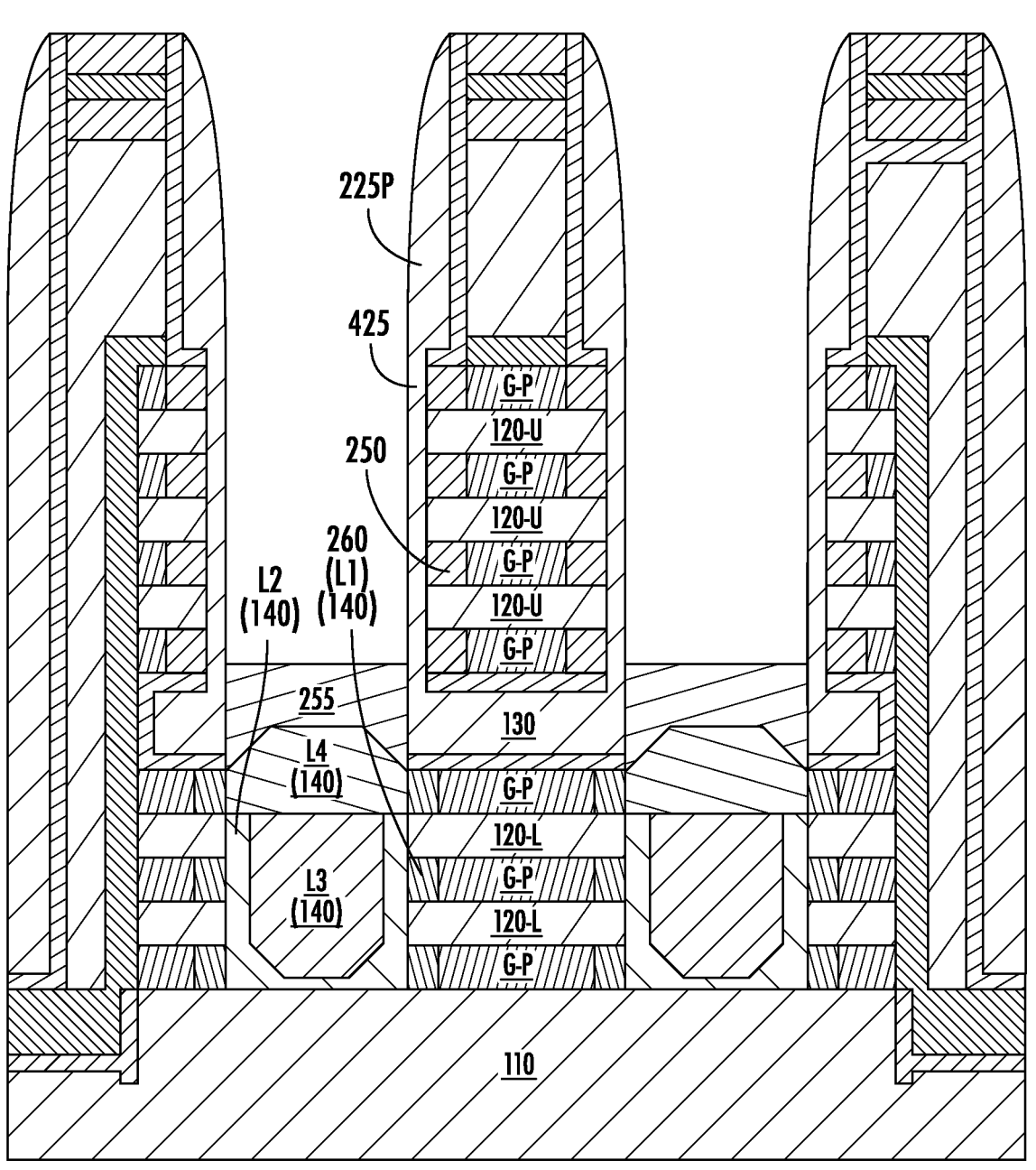

As shown in FIG. 4I, a fourth semiconductor layer L4 of the lower source/drain regions 140 may be formed on the upper surface of the third layer L3, and on the upper surface of the second layer L2. The fourth layer L4 may protect the second and third layers L2, L3 from etching. According to some embodiments, the second and third layers L2, L3 may have a higher concentration of germanium than the first and fourth layers L1, L4. In other embodiments, the four layers L1-L4 may all have the same concentration of germanium. Moreover, the layer L4 may be at a level above that of each of the lower semiconductor channel layers 120-L.

An insulating layer 255 may be formed on top of the fourth layer L4. The insulating layer 255 may electrically isolate the lower source/drain regions 140 from upper source/drain regions 150 (FIG. 2B) that will subsequently be formed.

Figure 4J:
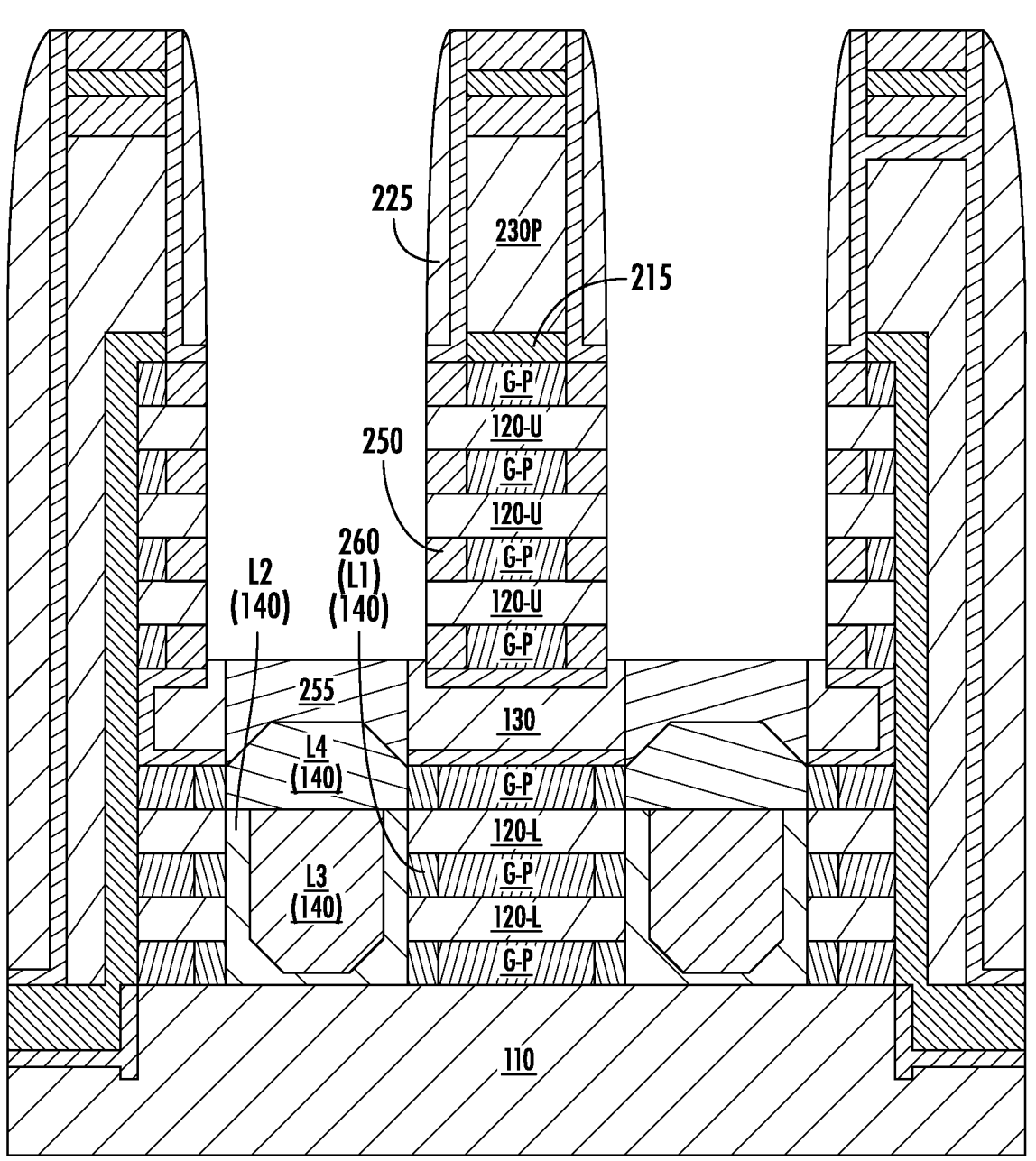

As shown in FIGS. 4J and 5B, the insulating layer 425 (FIG. 4I) that is on the sidewalls of the upper semiconductor channel layers 120-U, and on the sidewalls of the insulating spacers 250, may be etched (Block 585). As a result, the sidewalls of the upper semiconductor channel layers 120-U, and the sidewalls of the insulating spacers 250, may be exposed.

As shown in FIGS. 2B and 5B, upper source/drain regions 150 may be formed (Block 590) on the sidewalls of the upper semiconductor channel layers 120-U after etching the insulating layer 425 (FIG. 4J). For example, the upper source/drain regions 150 may be epitaxially grown from the exposed sidewalls of the upper semiconductor channel layers 120-U.

As shown in FIGS. 2B and 5B, upper and lower metal gates G-U, G-L may be formed (Block 595) after forming the upper source/drain regions 150. As an example, a replacement metal gate process may be performed to replace the upper ones of the sacrificial gate layers G-P (e.g., silicon germanium) with the upper metal gate G-U, and to replace the lower ones of the sacrificial gate layers G-P with the lower metal gate G-L. Moreover, gate insulation layers may be formed between the upper metal gate G-U and the upper semiconductor channel layers 120-U, and between the lower metal gate G-L and the lower semiconductor channel layers 120-L. Also, the layers 215, 230P that are on top of the sacrificial gate layers G-P may be sacrificial layers (e.g., polysilicon) that are replaced with metal to form an upper portion of the upper metal gate G-U during the replacement metal gate process.

Transistor devices 100 (FIG. 1) according to embodiments herein may provide a number of advantages. These advantages include reduced source/drain defects and improved stress engineering. For example, though insulating spacers on sidewalls of a gate can reduce capacitance between source/drain regions and the gate, the insulating spacers cannot be used as a seed layer for epitaxial growth of the source/drain regions. As a result, the source/drain regions may be formed with defects that reduce the ability to apply stress from the source/drain regions to semiconductor channel layers.

Referring to FIGS. 2A and 2B, however, a transistor stack 101 according to embodiments herein may include a combination of semiconductor spacers 260, which can be used as a seed layer for epitaxial growth of source/drain regions, and insulating spacers 250, which can reduce capacitance between source/drain regions and a gate. As a result, source/drain regions (e.g., lower source/drain regions 140 or upper source/drain regions 150) that are epitaxially grown from a combination of semiconductor channel layers 120 and the semiconductor spacers 260 may have fewer defects, and thus may have improved ability to apply stress to the semiconductor channel layers 120 (e.g., may facilitate increased current through the semiconductor channel layers 120). Accordingly, the transistor stack 101 including the semiconductor spacers 260 (in addition to the insulating spacers 250) may provide improved stress engineering relative to a transistor stack that includes insulating spacers 250 but not semiconductor spacers 260.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A transistor device comprising:
a substrate; and
a transistor stack comprising first and second transistors on the substrate,
wherein the first transistor comprises:
a plurality of first semiconductor channel layers;
a first source/drain region that is adjacent the plurality of first semiconductor channel layers;
a first gate on the plurality of first semiconductor channel layers; and
an insulating spacer that is on a sidewall of the first gate and between the plurality of first semiconductor channel layers,
wherein the second transistor comprises:
a plurality of second semiconductor channel layers;
a second source/drain region that is adjacent the plurality of second semiconductor channel layers;
a second gate on the plurality of second semiconductor channel layers; and
a semiconductor spacer that is on a sidewall of the second gate and between the plurality of second semiconductor channel layers, and
wherein the semiconductor spacer is part of the second source/drain region.

2. The transistor device of claim 1, wherein the insulating spacer comprises nitrogen.

3. The transistor device of claim 1, wherein the semiconductor spacer does not include nitrogen.

4. The transistor device of claim 1, wherein the semiconductor spacer comprises silicon, silicon germanium, or silicon carbide.

5. The transistor device of claim 1, wherein the first source/drain region is electrically connected to the plurality of first semiconductor channel layers,
wherein the second source/drain region is electrically connected to the plurality of second semiconductor channel layers, and
wherein the insulating spacer contacts the first source/drain region.

6. The transistor device of claim 5, wherein the first and second source/drain regions comprise different first and second semiconductor materials, respectively.

7. The transistor device of claim 6,
wherein the second source/drain region comprises a plurality of layers that each comprise the second semiconductor material,
wherein a first layer of the plurality of layers comprises the semiconductor spacer, and
wherein a second layer of the plurality of layers is on a sidewall of the semiconductor spacer.

8. The transistor device of claim 6, wherein the first and second semiconductor materials comprise:
silicon germanium and silicon carbide, respectively; or
silicon carbide and silicon germanium, respectively.

9. The transistor device of claim 1, wherein the first transistor is between the second transistor and the substrate.

10. The transistor device of claim 1, wherein the second transistor is between the first transistor and the substrate.

11. The transistor device of claim 1, wherein a thickness of the semiconductor spacer is equal to a thickness of a portion of the second gate that is between the plurality of second semiconductor channel layers.

12. The transistor device of claim 1, wherein the semiconductor spacer contacts the sidewall of the second gate.

13. A transistor device comprising:
a substrate; and
first and second transistors that are stacked on the substrate,
wherein an insulating spacer of the first transistor is on a sidewall of a gate of the first transistor and between a pair of semiconductor channel layers of the first transistor,
wherein no insulating spacer is on any sidewall of a gate of the second transistor and between a pair of semiconductor channel layers of the second transistor, and
wherein the first and second transistors are NMOS and PMOS transistors, respectively, or vice versa.

14. The transistor device of claim 13, further comprising a source/drain region that is electrically connected to the pair of semiconductor channel layers of the second transistor,
wherein a portion of the source/drain region is on a sidewall of the gate of the second transistor and between the pair of semiconductor channel layers of the second transistor.

15. The transistor device of claim 13, wherein the second transistor is between the first transistor and the substrate, or the first transistor is between the second transistor and the substrate.

16. A method of forming a transistor device, the method comprising:
forming an insulating spacer between a plurality of first semiconductor channel layers of a first transistor; and
forming a semiconductor spacer between a plurality of second semiconductor channel layers of a second transistor,
wherein the first and second transistors are in a transistor stack with each other, wherein the insulating spacer is on a sidewall of a first gate of the first transistor, wherein the semiconductor spacer is on a sidewall of a second gate of the second transistor, and wherein no insulating spacer is formed between the plurality of second semiconductor channel layers.

17. The method of claim 16, wherein forming the semiconductor spacer comprises forming a first layer of a source/drain region that is electrically connected to the plurality of second semiconductor channel layers, and wherein the method further comprises epitaxially growing a second layer of the source/drain region from the semiconductor spacer and the plurality of second semiconductor channel layers.

18. The method of claim 16, wherein forming the semiconductor spacer comprises epitaxially growing the semiconductor spacer from the plurality of second semiconductor channel layers.

19. The method of claim 16, wherein the first and second gates are formed by a replacement metal gate process after forming the insulating spacer and the semiconductor spacer, wherein the transistor stack is on a substrate, and wherein the second transistor is between the first transistor and the substrate, or the first transistor is between the second transistor and the substrate.

*    *    *    *    *